(12) United States Patent
Hayashi

(10) Patent No.: US 7,642,715 B2
(45) Date of Patent: Jan. 5, 2010

(54) LIGHT-EMITTING DEVICE COMPRISING AN IMPROVED GAS BARRIER LAYER, METHOD FOR MANUFACTURING LIGHT-EMITTING DEVICE, AND ELECTRONIC APPARATUS

(75) Inventor: Kenji Hayashi, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 640 days.

(21) Appl. No.: 11/332,139

(22) Filed: Jan. 17, 2006

(65) Prior Publication Data
US 2006/0158111 A1 Jul. 20, 2006

(30) Foreign Application Priority Data

Jan. 17, 2005 (JP) ............................. 2005-008695
Dec. 7, 2005 (JP) ............................. 2005-353028

(51) Int. Cl.
*H01J 1/62* (2006.01)
*H01J 63/04* (2006.01)
*H05B 33/04* (2006.01)

(52) U.S. Cl. ...................... 313/509; 313/500; 313/506; 313/511; 313/512; 428/690

(58) Field of Classification Search .......... 313/498–512
See application file for complete search history.

(56) References Cited

U.S. PATENT DOCUMENTS

| | | | | |
|---|---|---|---|---|
| 5,397,644 | A * | 3/1995 | Yamashita | 428/408 |
| 5,686,360 | A | 11/1997 | Harvey, III et al. | |
| 6,710,542 | B2 | 3/2004 | Chun et al. | |
| 7,075,106 | B2 * | 7/2006 | Shibata et al. | 257/40 |
| 7,081,701 | B2 * | 7/2006 | Yoon et al. | 310/369 |
| 7,109,655 | B2 * | 9/2006 | Kurihara | 313/512 |
| 7,242,375 | B2 * | 7/2007 | Hayashi et al. | 345/76 |
| 7,294,960 | B2 * | 11/2007 | Seki et al. | 313/504 |
| 2002/0018886 | A1 * | 2/2002 | Matsufuji et al. | 428/328 |
| 2002/0044111 | A1 * | 4/2002 | Yamazaki et al. | 345/83 |
| 2004/0070314 | A1 * | 4/2004 | Yoon et al. | 310/330 |
| 2004/0212759 | A1 | 10/2004 | Hayashi | |
| 2005/0040762 | A1 * | 2/2005 | Kurihara | 313/512 |
| 2005/0064239 | A1 * | 3/2005 | Takei | 428/690 |
| 2005/0067953 | A1 * | 3/2005 | Yamazaki et al. | 313/506 |
| 2005/0184655 | A1 * | 8/2005 | Kitamura | 313/504 |
| 2007/0132381 | A1 * | 6/2007 | Hayashi et al. | 313/512 |

(Continued)

FOREIGN PATENT DOCUMENTS

JP A 09-185994 7/1997

(Continued)

*Primary Examiner*—Sikha Roy
*Assistant Examiner*—Jose M Diaz
(74) *Attorney, Agent, or Firm*—Oliff & Berridge, PLC

(57) ABSTRACT

A light-emitting device includes a base; a plurality of first electrodes; a partition having a plurality of openings located at positions corresponding to the first electrodes; organic functional layers each arranged in the corresponding openings; a second electrode covering the partition and the organic functional layers; an organic buffer layer covering the second electrode; a gas barrier layer covering the organic buffer layer; and an intermediate protective layer, disposed between the organic buffer layer and the gas barrier layer, having an elasticity which is greater than that of the organic buffer layer and which is less than that of the gas barrier layer. These layers and electrodes are arranged on or above the base.

33 Claims, 19 Drawing Sheets

U.S. PATENT DOCUMENTS

2009/0051274 A1* 2/2009 Hayashi ...................... 313/504

FOREIGN PATENT DOCUMENTS

| | | |
|---|---|---|
| JP | A 2000-223264 | 8/2000 |
| JP | A 2001-284041 | 10/2001 |
| JP | A 2003-017244 | 1/2003 |
| JP | A 2003-142255 | 5/2003 |
| JP | A 2005-100943 | 4/2005 |
| KR | A 10-2004-0086556 | 10/2004 |

* cited by examiner

FIRST PRESSURE-
ADJUSTING SUB-STEP
(10 TO 1000 Pa)

DROP ADDITION
OF MATERIAL

SECOND PRESSURE-
ADJUSTING SUB-STEP
(2000 TO 5000 Pa)

THIRD PRESSURE-
ADJUSTING SUB-STEP
(ATMOSPHERIC PRESSURE)

FIG. 13

| | MATERIALS FOR FORMING INTERMEDIATE PROTECTIVE LAYERS (THICKNESS OF 100 nm) | ELASTICITY (GPa=$10^9 Nm^{-2}$) | CONDITION OF OUTER REGION |
|---|---|---|---|
| EXAMPLES | ALKALI HALIDE (LiF, MgF$_2$, OR ANOTHER HALIDE) | 15-68 | NOT PENETRATED BY MOISTURE AND TRANSPARENT |
| | Mg | 41 | |
| | Zn | 43 | |
| | Al | 69 | |
| | Ag | 76 | |
| | SiO$_2$ | 94 | |
| COMPARATIVE EXAMPLES | NO (INTERMEDIATE PROTECTIVE LAYER) | — | PENETRATED BY MOISTURE |
| | Ti | 116 | |
| | Pt | 172 | |
| | MgO | 240-275 | |
| | Si$_3$N$_4$ | 280-310 | |
| | Al$_2$O$_3$ | 385-392 | |

LIGHT-EMITTING DEVICE COMPRISING AN IMPROVED GAS BARRIER LAYER, METHOD FOR MANUFACTURING LIGHT-EMITTING DEVICE, AND ELECTRONIC APPARATUS

CROSS-REFERENCE TO RELATED APPLICATIONS

The present application claims priority to Japanese Patent Application No. 2005-008695 filed on Jan. 17, 2005 in Japan and Japanese Patent Application No. 2005-353028 filed on Dec. 7, 2005 in Japan, which are hereby expressly incorporated by reference herein in their entirety.

BACKGROUND

The present invention relates to a light-emitting device, a method for manufacturing the light-emitting device, and an electronic apparatus including the light-emitting device.

In recent years, flat-panel displays which have low power consumption and which are lightweight have been demanded since various information apparatuses incorporating the displays have been developed. An organic electroluminescent device including light-emitting layers is known as an example of such flat-panel displays. In the organic electroluminescent device, the light-emitting layers are usually arranged between a cathode and anodes. In order to enhance the hole injection efficiency and/or electron injection efficiency, the following organic electroluminescent devices have been disclosed: an organic electroluminescent device including hole injection layers arranged between anodes and light-emitting layers, an organic electroluminescent device including electron injection layers arranged between light-emitting layers and a cathode, and other organic electroluminescent devices.

Most of materials for forming light-emitting layers, hole injection layers, and electron injection layers included in organic electroluminescent devices are usually deteriorated by the reaction with moisture in air. If these layers are deteriorated, non-luminescent regions referred to as dark spots are caused in the organic electroluminescent devices. This leads to a reduction in life. In the organic electroluminescent devices, it is a challenge to prevent damage caused by moisture, oxygen, or the like.

In order to meet the challenge, the following technique has been usually used: a technique in which a sealing member made of glass or metal is joined to a substrate included in an organic electroluminescent device such that moisture and/or oxygen is prevented from penetrating the device. However, in large-screen displays having low thickness and weight, it is difficult to prevent the penetration of moisture and/or oxygen using only sealing members. Since such large-screen displays need to have an area sufficient to arrange driving elements and wires, a top-emission structure in which light is emitted through a sealing member has been disclosed. In order to cope with such a requirement, a sealing structure including a transparent, lightweight thin-film with high strength has been demanded.

In order to cope with large-screen flat displays, a technique referred to as thin-film passivation has been recently disclosed in, for example, JP-A-9-185994 (hereinafter referred to as Patent Document 1), JP-A-2001-284041 (hereinafter referred to as Patent Document 2), JP-A-2000-223264 (hereinafter referred to as Patent Document 3), and JP-A-2003-17244 (hereinafter referred to as Patent Document 4). In this technique, a thin-film serving as a gas barrier layer is formed over light-emitting elements by a high-density plasma deposition process such as an ion-plating process, an ECR plasma-enhanced sputtering process, an ECR plasma-enhanced CVD process, a microwave plasma-enhanced CVD process, or an ICP-CVD process using a transparent ceramic material, such as silicon nitride or silicon dioxide, having good gas barrier properties. This technique is effective in preventing moisture from penetrating the light-emitting elements.

However, even if this technique is used, the penetration of external moisture cannot be completely prevented; hence, sufficient luminescent properties and life cannot be achieved. In particular, steps present around the gas barrier layer or present on partitions for partitioning pixels are easily chipped or cracked and moisture penetrates the chipped or cracked steps.

The gas barrier layer can probably be prevented from being cracked in such a manner that an organic buffer layer of which the upper face is substantially flat is provided under the gas barrier layer. This is because the organic buffer layer can absorb the stress due to the warpage or volume expansion of a substrate. Since the upper face of the organic buffer layer is substantially flat, the gas barrier layer disposed on the upper face thereof is substantially flat; hence, the gas barrier layer has no stress-concentrated portion. This prevents the cracking of the gas barrier layer.

However, if the organic buffer layer is thermally distorted (expanded or shrunk), the gas barrier layer is cracked. Therefore, there is a problem in that the penetration of external moisture cannot be completely prevented.

SUMMARY

An advantage of the invention is that it provides light-emitting devices in which the penetration of moisture can be prevented if a gas barrier layer is chipped or cracked, a method for manufacturing a light-emitting device, and an electronic apparatus including a light-emitting device.

The invention provides light-emitting devices, a method for manufacturing a light-emitting device, and an electronic apparatus including a light-emitting device.

A light-emitting device according to the invention includes a base; a plurality of first electrodes; a partition having a plurality of openings located at positions corresponding to the first electrodes; organic functional layers each arranged in the corresponding openings; a second electrode covering the partition and the organic functional layers; an organic buffer layer covering the second electrode; a gas barrier layer covering the organic buffer layer; and an intermediate protective layer, disposed between the organic buffer layer and the gas barrier layer, having an elasticity which is greater than that of the organic buffer layer and which is less than that of the gas barrier layer. These layers and electrodes are arranged on or above the base.

According to the light-emitting device, since the intermediate protective layer is disposed between the organic buffer layer and the gas barrier layer, the thermal distortion (expansion or shrinkage) of the organic buffer layer is not directly transmitted to the gas barrier layer; hence, the gas barrier layers can be prevented from being damaged or cracked. In particular, although the gas barrier layer covering an end face of the organic buffer layer is easily damaged or cracked, the creation of defects such as cracks in the gas barrier layer can be effectively prevented by the presence of the intermediate protective layer.

In the light-emitting device, the intermediate protective layer preferably covers an outer region of the organic buffer layer. The intermediate protective layer prevents the creation of defects such as cracks in the gas barrier layer.

The intermediate protective layer preferably extends over a pattern of the organic buffer layer and a region outside the organic buffer layer. The intermediate protective layer prevents moisture from penetrating the organic buffer layer.

The light-emitting device may further include a cathode-protecting layer covering the second electrode. The cathode-protecting layer prevents the second electrode from being corroded and/or damage in manufacturing steps.

The gas barrier layer preferably extends over a pattern of the intermediate protective layer and a region outside the intermediate protective layer. The gas barrier layer protects the intermediate protective layer and the organic buffer layer from external moisture.

The light-emitting device may further include a protective layer covering the gas barrier layer. The protective layer protects the gas barrier layer from mechanical shocks applied from outside.

The organic buffer layer preferably has an end portion with a contact angle of 45 degrees or less. This prevents the stress caused by the thermal distortion (expansion or shrinkage) of the organic buffer layer from being transmitted to the gas barrier layer, resulting in preventing the creation of defects such as cracks in the gas barrier layer.

The intermediate protective layer may be made of a metal fluoride. In particular, the metal fluoride is preferably lithium fluoride or sodium fluoride.

Alternatively, the intermediate protective layer may be made of aluminum.

The intermediate protective layer preferably has an elasticity of 10 to 100 GPa. The intermediate protective layer can absorb the stress caused by the distortion of the organic buffer layer.

The organic buffer layer may be made of an epoxy resin. In this case, the organic buffer layer has good properties.

A light-emitting device according to the invention includes a base; a plurality of first electrodes; a partition having a plurality of openings located at positions corresponding to the first electrodes; organic functional layers each arranged in the corresponding openings; a second electrode covering the partition and the organic functional layers; an organic buffer layer which covers the second electrode and of which the upper face is flat; a first gas barrier layer covering the organic buffer layer; a second gas barrier layer; and an intermediate protective layer, disposed between the first and second gas barrier layers, having an elasticity which is greater than that of the organic buffer layer and which is less than that of one of the first and second gas barrier layers. These layers and electrodes are arranged on or above the base.

According to the light-emitting device, since the intermediate protective layer is disposed between the organic buffer layer and the gas barrier layer, the thermal distortion (expansion or shrinkage) of the organic buffer layer is not directly transmitted to the gas barrier layer; hence, the gas barrier layers can be prevented from being damaged or cracked. In particular, although the gas barrier layer covering an end face of the organic buffer layer is easily damaged or cracked, the creation of defects such as cracks in the gas barrier layer can be effectively prevented by the presence of the intermediate protective layer.

In the light-emitting device, the intermediate protective layer preferably lies on an outer region of the organic buffer layer. The intermediate protective layer prevents the creation of defects such as cracks in the gas barrier layer.

The first gas barrier layer preferably extends over a pattern of the organic buffer layer and a region outside the organic buffer layer and the intermediate protective layer preferably extends over a pattern of the organic buffer layer and a region outside the organic buffer layer. The intermediate protective layer and the first gas barrier layer prevent moisture from penetrating the organic buffer layer.

The second gas barrier layer preferably extends over a pattern of the intermediate protective layer and a region outside the intermediate protective layer. The second gas barrier layer prevents moisture from penetrating the organic buffer layer.

The first and second gas barrier layers are preferably in contact with each other at a position located above an outer region of the base. This prevents moisture from penetrating the intermediate protective layer.

The organic buffer layer preferably has an end portion with a contact angle of 45 degrees or less. This prevents the stress caused by the thermal distortion (expansion or shrinkage) of the organic buffer layer from being transmitted to the gas barrier layer, resulting in preventing the creation of defects such as cracks in the gas barrier layer.

The intermediate protective layer may be made of a metal fluoride. In particular, the metal fluoride is preferably lithium fluoride or sodium fluoride.

Alternatively, the intermediate protective layer may be made of aluminum.

The intermediate protective layer preferably has an elasticity of 10 to 100 GPa. The intermediate protective layer can absorb the stress caused by the distortion of the organic buffer layer.

The organic buffer layer may be made of an epoxy resin. In this case, the organic buffer layer has good properties.

A method for manufacturing a light-emitting device according to the invention includes forming a plurality of first electrodes; forming a partition having a plurality of openings located at positions corresponding to the first electrodes; forming organic functional layers each arranged in the corresponding openings; forming a second electrode covering the partition and the organic functional layers; forming an organic buffer layer which covers the second electrode and of which the upper face is flat; forming an intermediate protective layer, covering an outer region of the organic buffer layer, having an elasticity which is greater than that of the organic buffer layer and which is less than that of a gas barrier layer; and forming the gas barrier layer covering the intermediate protective layer and/or the organic buffer layer. These layers and electrodes are arranged on or above a base.

According to the method, since the intermediate protective layer is disposed between the organic buffer layer and the gas barrier layer, the thermal distortion (expansion or shrinkage) of the organic buffer layer is not directly transmitted to the gas barrier layer; hence, the gas barrier layers can be prevented from being damaged or cracked. In particular, although the gas barrier layer covering an end face of the organic buffer layer is easily damaged or cracked, the creation of defects such as cracks in the gas barrier layer can be effectively prevented by the presence of the intermediate protective layer.

A method for manufacturing a light-emitting device according to the invention includes forming a plurality of first electrodes; forming a partition having a plurality of openings located at positions corresponding to the first electrodes; forming organic functional layers each arranged in the corresponding openings; forming a second electrode covering the partition and the organic functional layers; forming an organic buffer layer which covers the second electrode and of which the upper face is flat; forming a first gas barrier layer covering the organic buffer layer; forming an intermediate protective layer, covering a region of the first gas barrier layer that corresponds to an outer region of the organic buffer layer, having an elasticity which is greater than that of the organic buffer layer and which is less than that of the first gas barrier layer; and forming a second gas barrier layer covering the intermediate protective layer and/or the first gas barrier layer. These layers and electrodes are arranged on or above a base.

According to this method, since the intermediate protective layer is disposed between the organic buffer layer and the gas barrier layer, the thermal distortion (expansion or shrinkage) of the organic buffer layer is not directly transmitted to the gas barrier layer; hence, the gas barrier layers can be prevented from being damaged or cracked. In particular, although the gas barrier layer covering an end face of the organic buffer layer is easily damaged or cracked, the creation of defects such as cracks in the gas barrier layer can be effectively prevented by the presence of the intermediate protective layer.

The intermediate protective layer may be made of a material with an elasticity of 10 to 100 GPa. The intermediate protective layer can absorb the stress caused by the organic buffer layer.

The organic buffer layer may be made of an epoxy resin. The organic buffer layer has good properties.

The organic buffer layer is preferably formed in a vacuum atmosphere by a screen-printing process. Moisture can be removed form the organic buffer layer and bubbles can be prevented from being created in the organic buffer layer.

An electronic apparatus according to the invention includes any one of the above light-emitting devices. According to the electronic apparatus, moisture hardly penetrates the organic buffer layer. This prevents the deterioration of the organic buffer layer. Therefore, the electronic apparatus has long life.

BRIEF DESCRIPTION OF THE DRAWINGS

The invention will be described with reference to the accompanying drawings, wherein like numbers reference like elements.

FIG. 13 is a table showing problems occurring in intermediate protective layers 212.

DETAILED DESCRIPTION OF EMBODIMENTS

Light-emitting devices, a method for manufacturing a light-emitting device, and an electronic apparatus according to embodiments of the invention will now be described with reference to the accompanying drawings. The light-emitting devices are described using electroluminescent (EL) display devices as examples. The EL display devices contain an organic EL material that is an example of an organic functional material.

First Embodiment

Figure 1:
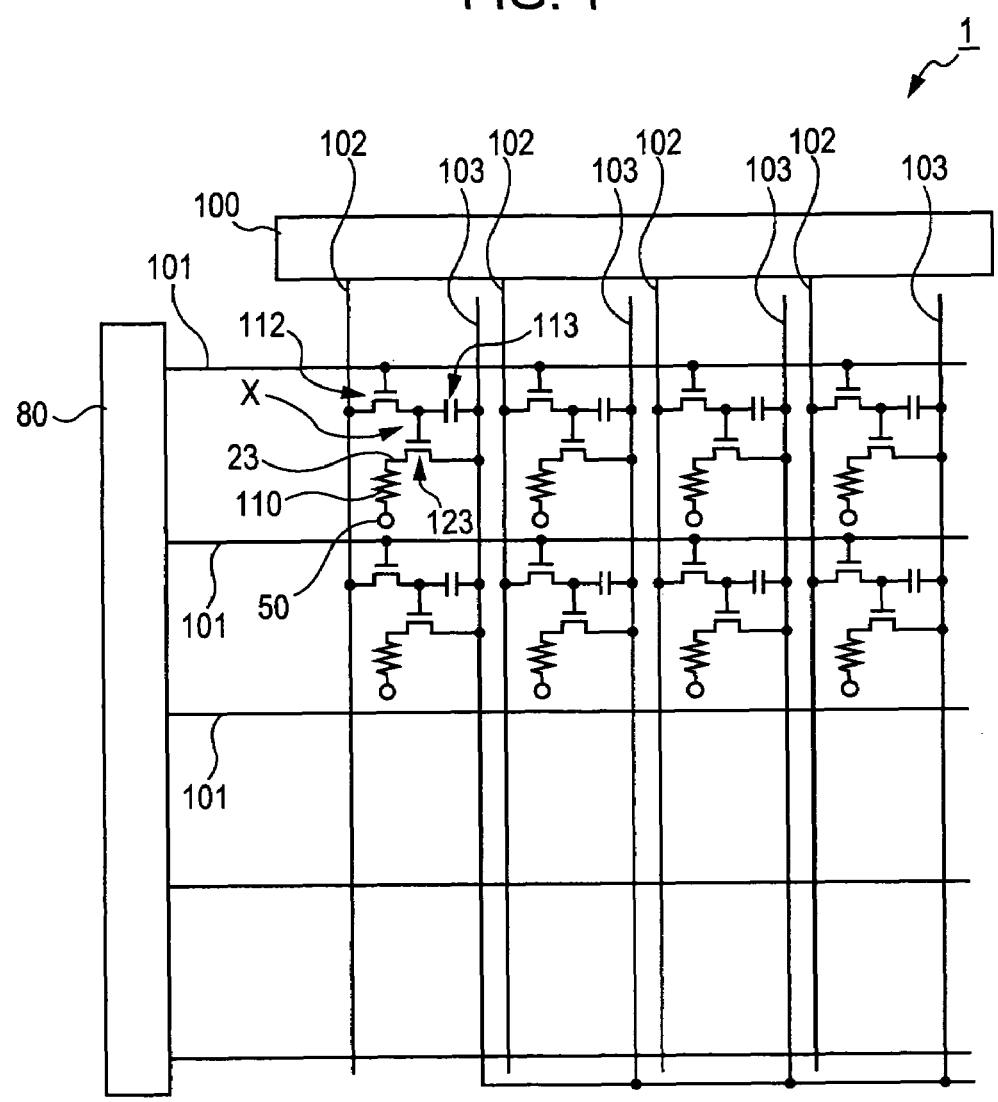
FIG. 1 is a wiring diagram of an EL display device 1 according to a first embodiment of the invention.

FIG. 1 is a wiring diagram of an EL display device (a light-emitting device) 1 according to a first embodiment of the invention.

The EL display device 1 includes thin-film transistors (hereinafter simply referred to as TFTs) serving as switching elements and is of an active matrix type.

In the drawings, in order to show layers and members included in the EL display device 1 on a recognizable scale, different scales are used depending on the size of the layers and members.

With reference to FIG. 1, the EL display device 1 includes a plurality of scanning lines 101, a plurality of signal lines 102 extending orthogonally to the scanning line 101, a plurality of power supply lines 103 extending parallel to the signal lines 102, pixel regions X located near the intersections of the scanning lines 101 and signal lines 102.

The signal lines 102 are connected to a data line-driving circuit 100 including a shift register, a level shifter, video lines, and analogue switches. The scanning lines 101 are connected to scanning line-driving circuits 80 including a shift register and a level shifter.

The following components are arranged in the pixel regions X: switching TFTs 112 having gate electrodes to which scanning signals are transmitted through the scanning lines 101, hold capacitors 113 for holding pixel signals transmitted through the signal lines 102 with the switching TFTs 112, driving TFTs 123 having gate electrodes to which the pixel signals held in the hold capacitors 113 are transmitted, pixel electrodes (first electrodes) 23 to which driving currents are applied through the power supply lines 103 when the pixel electrodes 23 are electrically coupled with the power supply lines 103 with the driving TFTs 123, a cathode (a second electrode) 50, and functional layers 110 sandwiched between the pixel electrodes 23 and portions of the cathode 50. Each pixel electrode 23, each portion of the cathode 50, and each functional layer 110 form each light-emitting element that is an organic EL element.

In the EL display device 1, when the switching TFTs 112 are turned on by driving the scanning lines 101, the potentials of the signal lines 102 are held with the hold capacitors 113 and the driving TFTs 123 are turned on or off depending on the state of the hold capacitors 113. Currents are applied to the pixel electrodes 23 through the power supply lines 103 with the driving TFTs 123 and then applied to the cathode 50 through the functional layers 110. The functional layers 110 emit light depending on the amounts of the currents flowing through the functional layers 110.

A configuration of the EL display device 1 will now be described in detail with reference to FIGS. 2 to 5.

Figure 2:
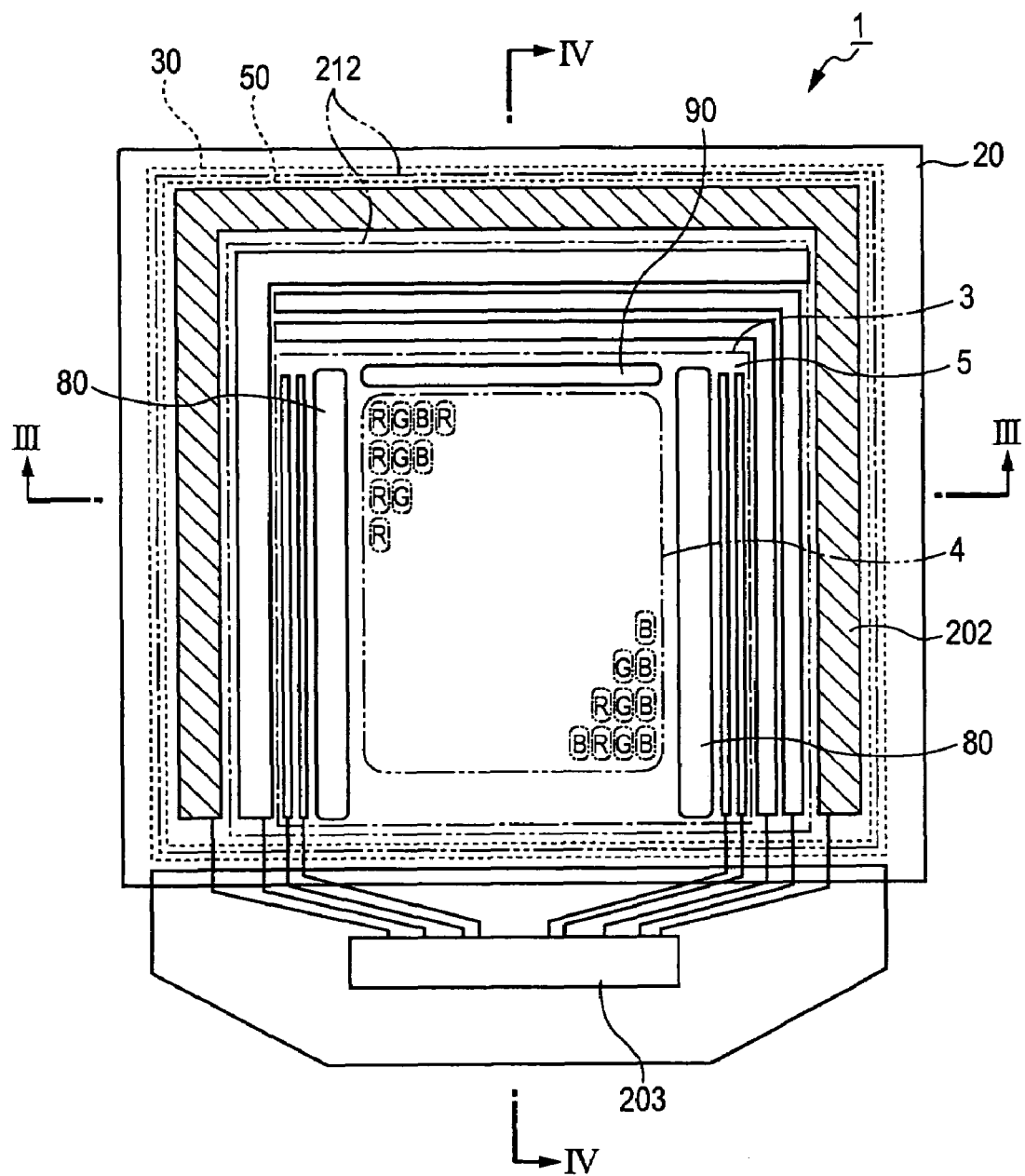
FIG. 2 is a schematic view showing a configuration of the EL display device 1.

With reference to FIG. 2, the EL display device 1 includes a substrate 20 that is electrically insulative; a pixel electrode region (not shown) containing the pixel electrodes 23 which are connected to the switching TFTs 112 (not shown) and which are arranged above the substrate 20 in a matrix; the power supply lines 103 (not shown) which are arranged around the pixel electrode region and which are each connected to the corresponding pixel electrodes 23; and a pixel section 3, which is surrounded by a single-dotted chain line, which is located on the pixel electrode region, and which has substantially a rectangular shape when viewed from above.

Figure 3:
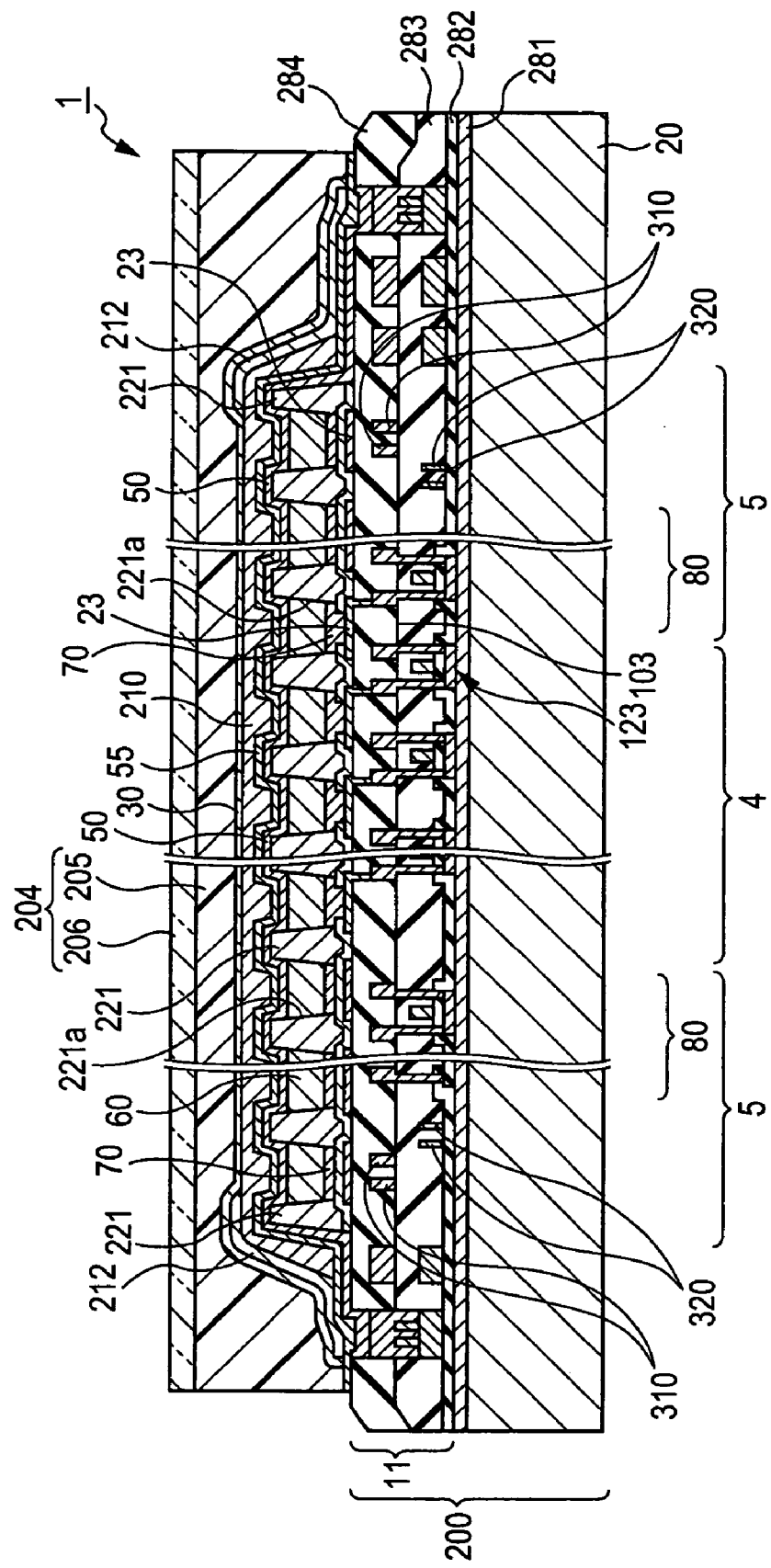
FIG. 3 is a sectional view of the EL display device taken along the line A-B of FIG. 2.
Figure 4:
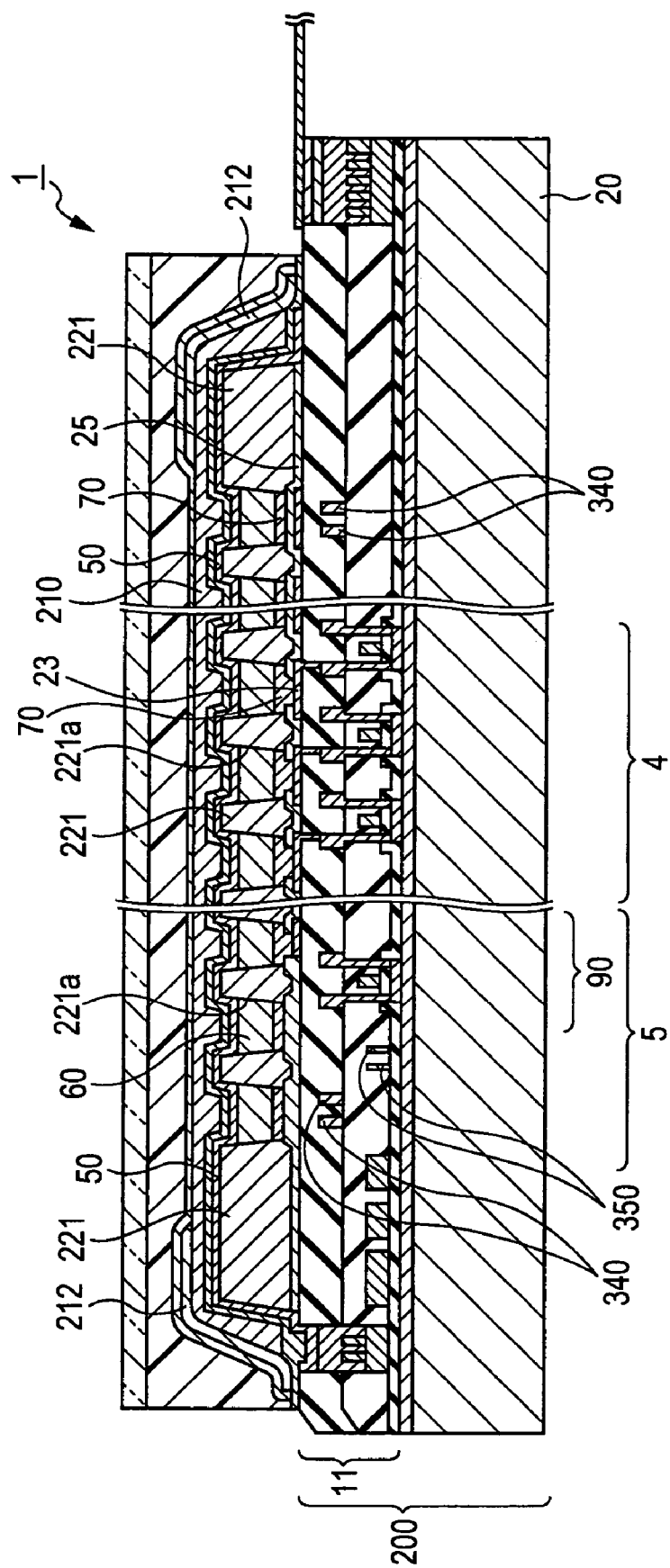
FIG. 4 is a sectional view of the EL display device taken along the line C-D of FIG. 2.

A zone in which the following components are arranged is herein referred to as a base 200: the substrate 20, the switching TFTs 112, various circuits, interlayer insulating layers, and other components shown in FIG. 3 or 4, these components being arranged above the substrate 20.

With reference to FIG. 2, the pixel section 3 is partitioned into an actual display region 4 and a dummy region 5. The actual display region 4 is surrounded by a two-dotted chain line and located at the center of the pixel section 3. The dummy region 5 is located between the single-dotted chain line and the two-dotted chain line and extends around the actual display region 4.

The actual display region 4 includes display sub-regions R, G, B which are arranged in a matrix in the A-B direction and the C-D direction and which are spaced apart from each other.

The scanning line-driving circuits 80 are arranged on both sides of the actual display region 4 and located at a level below the dummy region 5 shown in FIG. 2.

An inspection circuit 90 is disposed on the actual display region 4 as shown in FIG. 2. The inspection circuit 90 is used to check the operation of the EL display device 1 and includes, for example, an inspection data output unit (not shown) for outputting inspection data to an external apparatus. The quality and defects of the EL display device 1 can be checked using the inspection circuit 90 during the manufacture thereof or at the time of the delivery thereof. The inspection circuit 90 is located at a level below the dummy region 5.

Driving voltages are applied to the scanning line-driving circuits 80 and the inspection circuit 90 from a predetermined power supply section through first driving voltage-conducting sections 310 shown in FIG. 3 and second driving voltage-conducting sections 340 shown in FIG. 4. The driving voltages are applied to the scanning line-driving circuits 80 and the inspection circuit 90 with a main driver for controlling the operation of the EL display device 1 through a third driving voltage-conducting section 350 shown in FIG. 4. Driving control signals are transmitted to the scanning line-driving circuits 80 and the inspection circuit 90 with the main driver through driving control signal-conducting sections 320 shown in FIG. 3. The driving control signals are defined as command signals, transmitted from the main driver or the like, for controlling the output of signals from the scanning line-driving circuits 80 or the inspection circuit 90.

With reference to FIGS. 3 and 4, in the EL display device 1, a large number of the light-emitting elements including the pixel electrodes 23, light-emitting layers 60, and the cathode 50 are arranged above the base 200. The EL display device 1 further includes an organic buffer layer 210, an intermediate protective layer 212, and a gas barrier layer 30 which lie over the light-emitting elements.

The light-emitting layers 60 are typically electroluminescent and each include a carrier injection sub-layer such as a hole injection sub-layer or an electron injection sub-layer and a carrier transport sub-layer such as a hole transport sub-layer or an electron transport sub-layer. The light-emitting layers 60 may each further include a hole-blocking sub-layer and an electron-blocking sub-layer.

If the EL display device 1 is of a top emission type and light is therefore emitted through the gas barrier layer 30 opposed to the substrate 20, the substrate 20 disposed in the base 200 may be transparent or opaque. Examples of an opaque substrate include ceramic sheets such as alumina sheets; metal sheets, such as stainless steel sheets, subjected to insulating treatment such as surface oxidation; thermosetting resin films; thermoplastic resin films; and other plastic films.

If the EL display device 1 is of a bottom emission type, light is emitted through the substrate 20; hence, the substrate 20 must be transparent or translucent. Examples of a transparent or translucent substrate include glass substrates, quartz substrates, resin substrates, and plastic films. In particular, a glass substrate is preferable. In this embodiment, since the EL display device 1 is of such a top emission type, the substrate 20 is an opaque plastic film.

The driving TFTs 123 for driving the pixel electrodes 23 are arranged in a circuit section 11 disposed above the substrate 20. A large number of the light-emitting elements are arranged above the circuit section 11. The light-emitting elements include the pixel electrodes 23 serving as anodes, hole transport layers 70 for injecting and transporting holes supplied from the pixel electrodes 23, the light-emitting layers 60 made of an organic EL material, and portions of the cathode 50, these components being arranged in that order.

In the light-emitting elements having the above configuration, the light-emitting layers 60 emit light when holes injected from the hole transport layers 70 are coupled with electrons injected from the cathode 50.

In this embodiment, since the EL display device 1 is of the top emission type, the pixel electrodes 23 need not be transparent and may therefore be made of any conductive material.

Examples of a material for forming the hole transport layers 70 include polythiophenes, polypyrroles, doped polythiophenes, and doped polypyrroles. In particular, the hole transport layers 70 are formed as follows: a 3,4-polyethylenedioxythiophene/polystyrene sulfonic acid (PEDOT/PSS) dispersion is prepared by dispersing 3,4-polyethylenedioxythiophene in polystyrene sulfonic acid which is a dispersion medium, water is added to the dispersion, and the hole transport layers 70 are formed using the resulting dispersion.

The light-emitting layers 60 may be made of a known luminescent material that can fluoresce or phosphoresce. Preferable examples of such a luminescent material include polyfluorenes (PFs), polyparaphenylene vinylenes (PPVs), polyphenylenes (PPs), polyparaphenylenes (PPPs), polyvinylcarbazoles (PVKs), polythiophenes, and polysilanes such as polymethylphenylsilane (PMPS).

The luminescent material may be doped with a polymeric material such as a perylene dye, a coumarin dye, or a rhodamine dye or a low-molecular material such as rubrene, perylene, 9,10-diphenylanthracene, tetraphenylbutadiene, Nile red, coumarin 6, or quinacridone.

A known low-molecular material may be used instead of the luminescent material.

Electron injection layers may be each placed on the corresponding light-emitting layers 60 as required.

In this embodiment, as shown in FIGS. 3 and 4, the hole transport layers 70 and the light-emitting layers 60 are arranged above the base 200 in such a manner that the hole transport layers 70 and the light-emitting layers 60 are surrounded by an organic partitioning layer (a partition) 221 and lyophilic control layers 25 (not shown) arranged in an array. Hence, the hole transport layers 70 and the light-emitting layers 60 form element layer sections included in the light-emitting elements isolated from each other.

The organic partitioning layer 221 has openings 221a. The walls of the openings 221a make an angle of 110 to 170 degrees with the upper face of the base 200. This is because the light-emitting layers 60 are each readily formed in the corresponding openings 221a by a wet process.

With reference to FIGS. 2 to 4, the cathode 50 has an area greater than the sum of the areas of the actual display region 4 and the dummy region 5 and covers the actual display region 4 and the dummy region 5. The cathode 50 is disposed above the base 200 such that the cathode 50 covers the light-emitting layers 60 and the upper face and side faces of the organic partitioning layer 221. With reference to FIG. 4, the cathode 50 is connected to a cathode line 202 which is disposed outside the organic partitioning layer 221 and which extends above an outer region of the base 200. Therefore, the cathode 50 is connected to a driving circuit (not shown), disposed above a flexible substrate 203, with the cathode line 202 disposed therebetween.

Since the EL display device 1 is of the top emission type as described above, the cathode 50 must be light-transmissive and is therefore made of a transparent conductive material. The transparent conductive material is preferably indium tin oxide (ITO). Alternatively, the transparent conductive material may be indium zinc oxide (IZO), for example, IZO®, which is an amorphous transparent conductive material. In this embodiment, ITO is used.

Alternatively, the cathode 50 is preferably made of a material having high electron injection efficiency. Examples of such a material include calcium, magnesium, sodium, lithium, and a metal compound containing one of these elements. Examples of such a metal compound include metal fluorides such as calcium fluoride, metal oxides such as lithium oxide, and organometallic complexes such as calcium acetylacetonate. If the cathode 50 is made of one of these materials, the cathode 50 has high electrical resistance and cannot function well; hence, a metal layer made of aluminum, gold, silver, or copper may be provided on a non-pixel region located on the organic partitioning layer 221 by patterning or a conductive layer made of a transparent metal oxide such as ITO or tin oxide may be used in combination with the cathode 50. In this embodiment, the cathode 50 includes a lithium fluoride layer, a magnesium-silver alloy layer, and an ITO layer and the thickness of the cathode 50 is adjusted such that the cathode 50 is transparent.

With reference to FIGS. 3 and 4, a cathode-protecting layer (an electrode-protecting layer) 55 is disposed on the cathode 50. The cathode-protecting layer 55 protects the cathode 50 from being corroded or damaged, in manufacturing steps, due to remaining moisture and/or an organic solvent used to form the organic buffer layer 210.

In view of transparency, density, water resistance, and gas barrier properties, the cathode-protecting layer 55 is preferably made of an inorganic material. Examples of such an inorganic material include a nitrogen-containing silicon compound such as silicon nitride oxide or a metal compound such as titanium oxide. A material for forming the cathode-protecting layer 55 preferably has an elasticity of 100 GPa or more.

The cathode-protecting layer 55 is formed by a high-density plasma-enhanced CVD process such as an ECR sputtering process or an ion-plating process. In order to prevent cracking, the cathode-protecting layer 55 preferably has a thickness of 200 nm or less and more preferably 30 to 100 nm.

The cathode-protecting layer 55 has a thickness of about 30 to 100 nm lies over the cathode 50 to contact an insulating layer 284 disposed on an outer region of the base 200.

With reference to FIGS. 2 to 4, the organic buffer layer 210 has an area greater than that of the organic partitioning layer 221 and lies on the cathode-protecting layer 55 to cover the cathode 50. The organic buffer layer 210 may cover portions of the cathode 50 that are arranged in the pixel section 3 or may further cover portions of the cathode 50 that are arranged on the cathode line 202 extending above an outer region of the base 200.

The organic buffer layer 210 is used to correct irregular portions of the cathode 50 that are caused by the shape of the organic partitioning layer 221. The upper face of the organic buffer layer 210 is substantially flat. The organic buffer layer 210 absorbs the stress caused by the warpage or volume expansion of the base 200 to prevent the cathode 50 from being separated from the organic partitioning layer 221 which is unstable. Since the upper face of the organic buffer layer 210 is substantially flat, the gas barrier layer 30 which lies on the organic buffer layer 210 and which is a hard coating is also flat and therefore has no stress-concentrated portion. This prevents the cracking of the gas barrier layer 30.

The organic buffer layer 210 is formed in a vacuum by a printing process. Therefore, a material for forming the organic buffer layer 210 needs to have high fluidity and needs to contain no solvent but organic monomers or oligomers before this material is cured. This material preferably contains epoxy monomers or oligomers with a molecular weight of 3000 or less. Compounds with a molecular weight of 1000 or less are herein defined as monomers and compounds with a molecular weight which is greater than 1000 and which is less than or equal to 3000 are herein defined as oligomers. Examples of the epoxy monomers or oligomers include bisphenol-A epoxy oligomers, bisphenol-F epoxy oligomers, phenol-novolac epoxy oligomers, polyethylene glycol diglycidyl ether, alkylglycidyl ether, 3,4-epoxycyclohexylmethyl-3',4'-epoxycyclohexanecarboxylate, and ε-caprolactone-modified 3,4-epoxycyclohexylmethyl-3',4'-epoxycyclohexanecarboxylate. These monomers or oligomers may be used alone or in combination.

A curing agent reactable with the epoxy monomers or oligomers is preferably used. The curing agent is preferably useful in forming a transparent cured coating having good electrical insulating properties, high adherence, high hardness, high toughness, and high heat resistance. Furthermore, the curing agent is preferably suitable for addition polymerization because this material can be uniformly cured. Examples of the curing agent include anhydride curing agents such as 3-methyl-1,2,3,6-tetrahydrophthalic anhydride, methyl-3,6-endomethylene-1,2,3,6-tetrahydrophthalic anhydride, 1,2,4,5-benzenetetracarboxylic dianhydride, and 3,3', 4,4'-benzophenonetetracarboxylic dianhydride. If the curing agent is used in combination with a less-volatile alcohol, such as 1,6-hexane diol which is a reaction accelerator for promoting the ring opening reaction of acid anhydrides, having high molecular weight, this material can be readily cured at a low temperature. This material is usually cured at a temperature of 60° C. to 100° C. After being cured, the organic buffer layer 210 contains polymers having ester bonds.

Furthermore, if the curing agent is used in combination with a curing accelerator, having relatively high molecular weight, for promoting the ring opening reaction of acid anhydrides, this material can be cured at a lower temperature in a shorter time. Examples of the curing accelerator include aromatic amines, alcohols, and aminophenols.

It is not preferable to use an additive such as a cationic photopolymerization initiator usually used to reduce the curing time, because the organic buffer layer 210 is colored and/or the light-emitting layers 60 are damaged due to the stress caused by the rapid shrinkage of the organic buffer layer 210 during curing. However, the following additive may be used in combination with the curing agent: a photosensitizer serving as a catalyst, a silane-coupling agent for enhancing the adhesion of the organic buffer layer 210 with the cathode 50 and the gas barrier layer 30, a desiccant such as an isocyanate, and an additive containing particles for preventing shrinkage during curing.

These compounds for forming the organic buffer layer 210 preferably have a viscosity of 1,000 mPa·s or more at room temperature, for example, 25° C. This is because the creation of the following regions is prevented: non-luminescent regions which are referred to as dark spots and which are created due to the penetration of these compounds if these compounds have a lower viscosity. A mixture, containing some of these compounds, for forming the organic buffer layer 210 preferably has a viscosity of 500 to 20,000 mPa·s and more preferably 2,000 to 10,000 mPa·s at room temperature, for example, 25° C.

The organic buffer layer 210 preferably has a thickness of 3 to 10 µm. This is because when the thickness of the organic buffer layer 210 is 3 µm or more, the gas barrier layer 30 can be prevented from being damaged due to dust particles, hardly removed from a clean room, having a size of 1 µm or less.

After being cured, the organic buffer layer 210 preferably has an elasticity of 1 to 10 GPa. When the organic buffer layer 210 has an elasticity of more than 10 GPa, the organic buffer layer 210 cannot absorb the stress caused by the planarization of the organic partitioning layer 221. When the organic buffer layer 210 has an elasticity of less than 1 GPa, the abrasion resistance and/or heat resistance thereof is insufficient.

The organic buffer layer 210 is preferably formed on the cathode-protecting layer 55 in a vacuum by a screen-printing process. In particular, the mixture for forming the organic buffer layer 210 is transferred onto the cathode-protecting layer 55 included in the base 200 in such a manner that a mask including a mesh screen having a pattern, corresponding to an uncoated region, formed by applying a cured emulsion onto the mesh screen is placed onto the cathode-protecting layer 55, the mixture is applied onto the mask, and the mask is then pressed against the cathode-protecting layer 55 with a squeegee. If the mixture is transferred onto the cathode-protecting layer 55 in a vacuum, the mixture can be prevented from absorbing moisture; hence, bubbles due to moisture can be prevented from being created in the coating formed on the cathode-protecting layer 55.

A polymer such as a polyolefin or a polyether may be used to form the organic buffer layer 210. Alternatively, an organosilicon polymer produced by the following procedure may be used: an alkoxysilane such as methyltrimethoxysilane or tetramethoxysilane is hydrolyzed and the hydrolysis products are subjected to polymerization. The following derivative may be also used: a derivative produced by modifying a polymer such as an acrylic polyol, a methacrylic polyol, a polyester polyol, a polyether polyol, or a polyurethane polyol with an isocyanate such as tolylene diisocyanate or xylylene diisocyanate; a polymeric derivative produced by modifying a bisphenol epoxy resin with a carboxylic dianhydride or an amine; or another organic derivative.

If a polymer containing a silane compound such as a silane-coupling agent is used to form the organic buffer layer 210, the adherence of the organic buffer layer 210 with the cathode 50 and gas barrier layer 30 made of inorganic materials can be enhanced. Examples of such a silane-coupling agent include 3-aminopropyltrimethoxysiloxane and 3-glycidoxypropyltrimethoxysiloxane.

If the EL display device 1 is of the top emission type, the organic buffer layer 210 need not be transparent; hence, a material containing a photopolymerization initiator sensitive to ultraviolet (UV) light may be used to form the organic buffer layer 210. In particular, if this material is UV- and heat-curable, the curing shrinkage of the organic buffer layer 210 can be prevented and the heating time during curing can be reduced. This leads to an increase in manufacturing efficiency. In this case, the cathode-protecting layer 55 is preferably made of a material absorbing UV light. Examples of such a UV light-absorbing material include oxide semiconductors, such as titanium oxide, zinc oxide, and ITO, having an energy bandgap of 2 to 4 eV. If the cathode-protecting layer 55 is made of at least one of such oxide semiconductors, the cathode-protecting layer 55 absorbs UV light passing through the organic buffer layer 210. This prevents the deterioration of the light-emitting layers 60 if the organic buffer layer 210 is irradiated with UV light. Furthermore, an additive containing particles for preventing the curing shrinkage of the organic buffer layer 210 may be used in combination with the UV- and heat-curable material.

With reference to FIGS. 2 to 4, the intermediate protective layer 212 lies on the organic buffer layer 210.

A material for forming the intermediate protective layer 212 has an elasticity less than that of the gas barrier layer 30 and greater than that of the organic buffer layer 210. In particular, this material preferably has an elasticity 10 to 100 GPa ($1 \times 10^{10}$ to $10 \times 10^{10}$ $Nm^{-2}$).

This material is preferably, for example, a metal or fluoride having an elasticity less than that of an nitride or an oxide. Examples of this material include alkali halides, such as LiF and $MgF_2$, having an elasticity of 15 to 68 GPa and inorganic materials such as Mg, Zn, Al, Ag, $SiO_2$, NaF, and Sn. The elasticity of Mg is 41 GPa, that of Zn is 43 GPa, that of Al is 69 GPa, that of Ag is 76 GPa, that of $SiO_2$ is 94 GPa, that of NaF is 50 GPa, and that of Sn is 55 GPa.

The organic buffer layer 210 preferably has an elasticity of 10 GPa or less. When the organic buffer layer 210 is made of an epoxy resin, the organic buffer layer 210 has an elasticity of 3 to 5 GPa ($0.3 \times 10^{10}$ to $0.5 \times 10^{10}$ $Nm^{-2}$). The gas barrier layer 30 preferably has an elasticity of 100 GPa or more. When the gas barrier layer 30 is made of, for example, silicon nitride or silicon nitride oxide, the gas barrier layer 30 has an elasticity of 200 to 400 Gpa ($20 \times 10^{10}$ to $40 \times 10^{10}$ $Nm^{-2}$).

A material for forming the intermediate protective layer 212 may be metal or resin. A resin containing particles 213, shown in FIG. 5, serving as filler is preferably used to form the intermediate protective layer 212 such that the intermediate protective layer 212 has a desired elasticity. Since the intermediate protective layer 212 contains the particles 213, the volume of the intermediate protective layer 212 is hardly varied during the formation of a coating or at the change in temperature. This leads to a reduction in stress applied to the gas barrier layer 30. The particles 213 are made of an organic polymer such as polyester or polymethylmethacrylate (PMMA) or an inorganic oxide such as silica or alumina.

The material for forming the intermediate protective layer 212 preferably has affinity to the organic buffer layer 210 and the gas barrier layer 30.

The intermediate protective layer 212 preferably extends over outer regions of the organic buffer layer 210 and further extends over areas outside the organic buffer layer 210. The organic buffer layer 210 has a flat region such that lights emitted from the light-emitting layers 60 pass through the flat region and the gas barrier layer 30 lying over the flat region is prevented from being cracked. The intermediate protective layer 212 has an opening located on the flat region of the organic buffer layer 210 and lies over the outer regions of the organic buffer layer 210. That is, the intermediate protective layer 212 lies below an outer region of the gas barrier layer 30 that is easily cracked.

With reference to FIGS. 2 to 4, the gas barrier layer 30 lies on the intermediate protective layer 212.

The gas barrier layer 30 prevents the penetration of oxygen and moisture, thereby protecting the cathode 50 and the light-emitting layers 60 from being deteriorated due to oxygen or moisture.

The gas barrier layer 30 is preferably made of an inorganic compound, more preferably a silicon compound, and further more preferably silicon nitride or silicon nitride oxide, containing nitrogen, having high water resistance. The gas barrier layer 30 must be dense and defect-free so as to block gas such as moisture. Therefore, the gas barrier layer 30 is preferably formed by a high-density plasma deposition process that is suitable for forming a dense layer at a low temperature. Alternatively, the gas barrier layer 30 may be made of aluminum oxide, tantalum oxide, titanium oxide, or another ceramic instead of the silicon compound.

The gas barrier layer 30 preferably has an elasticity of 100 GPa or more and more preferably about 200 to 250 GPa.

The gas barrier layer 30 may have a multilayer structure or the composition of the gas barrier layer 30 may be nonuniform. In particular, the content of oxygen in the gas barrier layer 30 may vary continuously or stepwise.

The gas barrier layer 30 preferably has a thickness of 30 to 1,000 nm and more preferably about 200 to 600 nm.

If the gas barrier layer 30 has a thickness of less than 30 nm, the gas barrier layer 30 can be perforated due to defects in the gas barrier layer 30 or a difference in thickness between portions of the gas barrier layer 30; hence, the gas barrier layer 30 has low barrier layer properties. In contrast, if the gas barrier layer 30 has a thickness of more than 1,000 nm, the gas barrier layer 30 can be cracked due to the stress applied thereto.

In the same view as described above, the sum of the thickness of the intermediate protective layer 212 and that of the gas barrier layer 30 is preferably 1,000 nm or less.

In this embodiment, since the EL display device 1 is of the top emission type, the gas barrier layer 30 must be light-transmissive. Therefore, a component contained in the gas barrier layer 30 is properly selected and the thickness thereof is properly adjusted such that the gas barrier layer 30 has a transmittance of, for example, 80% or more in the visible range.

Figure 5:
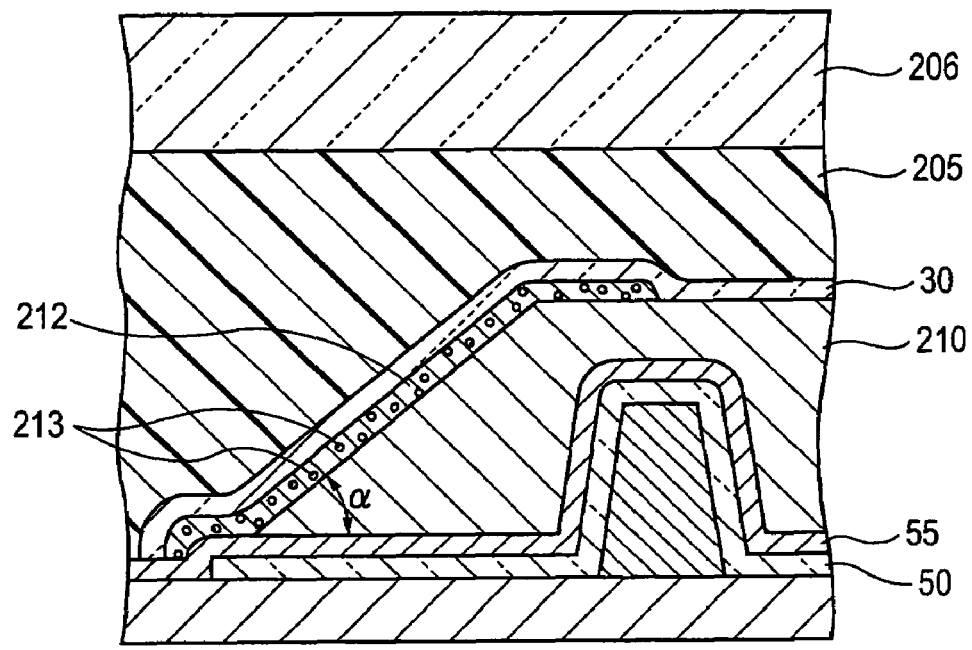
FIG. 5 is an enlarged view of an end portion (an outer region) of an organic buffer layer 210.

A configuration of an end portion (an outer region) of the organic buffer layer 210 will now be described with reference to FIG. 5. FIG. 5 is an enlarged view of the end portion thereof.

The organic buffer layer 210 lies on the cathode-protecting layer 55 and the end portion of the organic buffer layer 210 makes a contact angle α with the upper face of the cathode-protecting layer 55. The contact angle α is preferably 45 degrees or less and more preferably one to 20 degrees. Since the organic buffer layer 210 has such a configuration, the organic buffer layer 210 and gas barrier layer 30 lying on the organic buffer layer 210 follow the shape of the organic buffer layer 210. Therefore, an end portion of the gas barrier layer 30 is not sharply sloped but gently sloped. This prevents the creation of defects, such as cracks, due to stress concentration.

The end portion of the gas barrier layer 30 is disposed above the end portion of the organic buffer layer 210 that is easily cracked, with the intermediate protective layer 212 disposed therebetween. The intermediate protective layer 212 extends to a region outside the organic buffer layer 210 and the gas barrier layer 30 extends to a region outside the intermediate protective layer 212. Since the intermediate protective layer 212 and the gas barrier layer 30 are arranged on the organic buffer layer 210 as described above, the gas barrier layer 30 can be effectively prevented from being damaged or cracked due to stress concentration. Furthermore, since the gas barrier layer 30 extends to the region outside the intermediate protective layer 212, the intermediate protective layer 212 can be prevented from being deteriorated due to the contact with moisture or oxygen. Therefore, the sealing ability of the intermediate protective layer 212 maintained for a long time.

With reference back to FIGS. 3 and 4, a protective layer 204 lies over the gas barrier layer 30. The protective layer 204 includes a surface-protecting substrate (a protective base) 206 and an adhesive sub-layer (a resin adhesive sub-layer) 205 lying on the gas barrier layer 30.

The adhesive sub-layer 205 has a function of fixing the surface-protecting substrate 206 above the gas barrier layer 30 and a function of absorbing mechanical shocks applied from outside so as to protect the light-emitting layers 60 and the gas barrier layer 30. The adhesive sub-layer 205 and the surface-protecting substrate 206 are joined to each other. The adhesive sub-layer 205 is made of an adhesive which contains a urethane resin, an acrylic resin, an epoxy resin, or a polyolefin, which is more flexible than that of the surface-protecting substrate 206, and which has a glass transition point lower than that of the surface-protecting substrate 206. The adhesive sub-layer 205 is preferably transparent. Alternatively, the adhesive sub-layer 205 may be made of a tow-part adhesive containing a curing agent for curing this adhesive at a low temperature.

The adhesive sub-layer 205 preferably contains a silane coupling agent or an alkoxysilane so as to have affinity to the gas barrier layer 30. This enhances the function of absorbing the mechanical shocks.

When the gas barrier layer 30 is made of the silicon compound, such a silane coupling agent or an alkoxysilane is effective in enhancing the affinity of the adhesive sub-layer 205 to the gas barrier layer 30. This leads to an increase in gas barrier properties of the gas barrier layer 30.

The surface-protecting substrate 206 lies on the adhesive sub-layer 205, that is, the surface-protecting substrate 206 is located on the outer side of the protective layer 204. The surface-protecting substrate 206 has at least one selected from the group consisting of pressure resistance, abrasion resistance, the ability to prevent the reflection of external light, the ability to block gas, and the ability to block UV light.

The surface-protecting substrate 206 is preferably made of glass, diamond-like carbon (DLC), a transparent plastic material, or a transparent plastic film. Examples of such a transparent plastic material include polyethylene terephthalate (PET), acrylic resins, polycarbonates, and polyolefins.

The surface-protecting substrate 206 may include an optical member such as a UV light-blocking/absorbing layer, a light reflection-preventing layer, a heat radiation layer, a lens, a color/wavelength conversion layer, or a mirror.

Since the EL display device 1 is of the top emission type, the surface-protecting substrate 206 and the adhesive sub-layer 205 must be light-transmissive. However, if the EL display device 1 is of the bottom emission type, the surface-protecting substrate 206 and the adhesive sub-layer 205 need not be light-transmissive.

A method for manufacturing the EL display device 1 of this embodiment will now be described with reference to FIGS. 6 and 7. FIGS. 6A to 6C and 7A to 7C are sectional views taken along the line A-B of FIG. 2.

In this embodiment, the EL display device 1 is of the top emission type as described above. Since a step of forming the circuit section 11 above the substrate 20 and steps prior to this step are performed by known techniques, the descriptions of these steps are omitted.

Figure 6A:
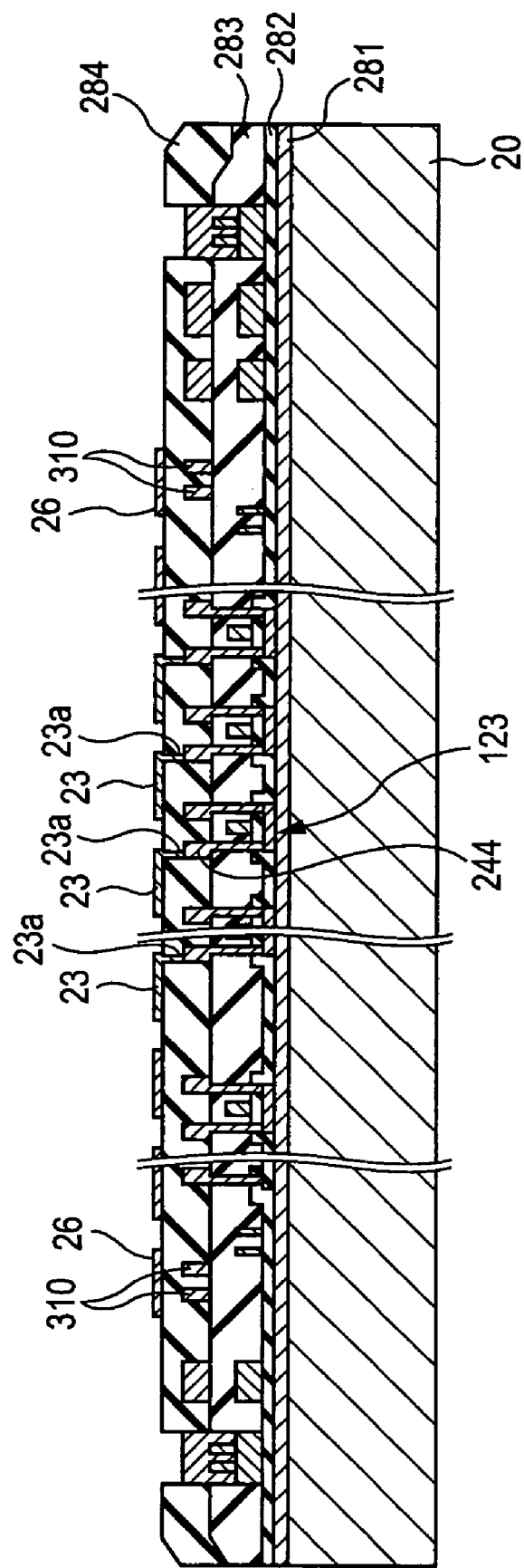
FIGS. 6A to 6C are illustrations showing steps of manufacturing the EL display device 1.

As shown in FIG. 6A, a transparent conductive layer for forming the pixel electrodes 23 is formed over the circuit section 11 disposed above the substrate 20 and then patterned, whereby the pixel electrodes 23 and dummy patterns 26 present in the dummy region 5 are formed. The pixel electrodes 23 are electrically connected to drain electrodes 244 through contact holes 23a arranged in the insulating layer 284.

In the descriptions of FIGS. 3 and 4, the pixel electrodes 23 and the dummy patterns 26 are collectively referred to as "pixel electrodes 23". The dummy patterns 26 are insulated from metal wires present below the dummy patterns 26 with the insulating layer 284. The dummy patterns 26 are arranged in a dotted pattern and have substantially the same shape as that of the pixel electrodes 23 arranged in the actual display region 4. The dummy patterns 26 may have a configuration and/or a shape different from that of the pixel electrodes 23. The dummy patterns 26 are arranged above the first and second driving voltage-conducting sections 310 and 340.

Figure 6B:
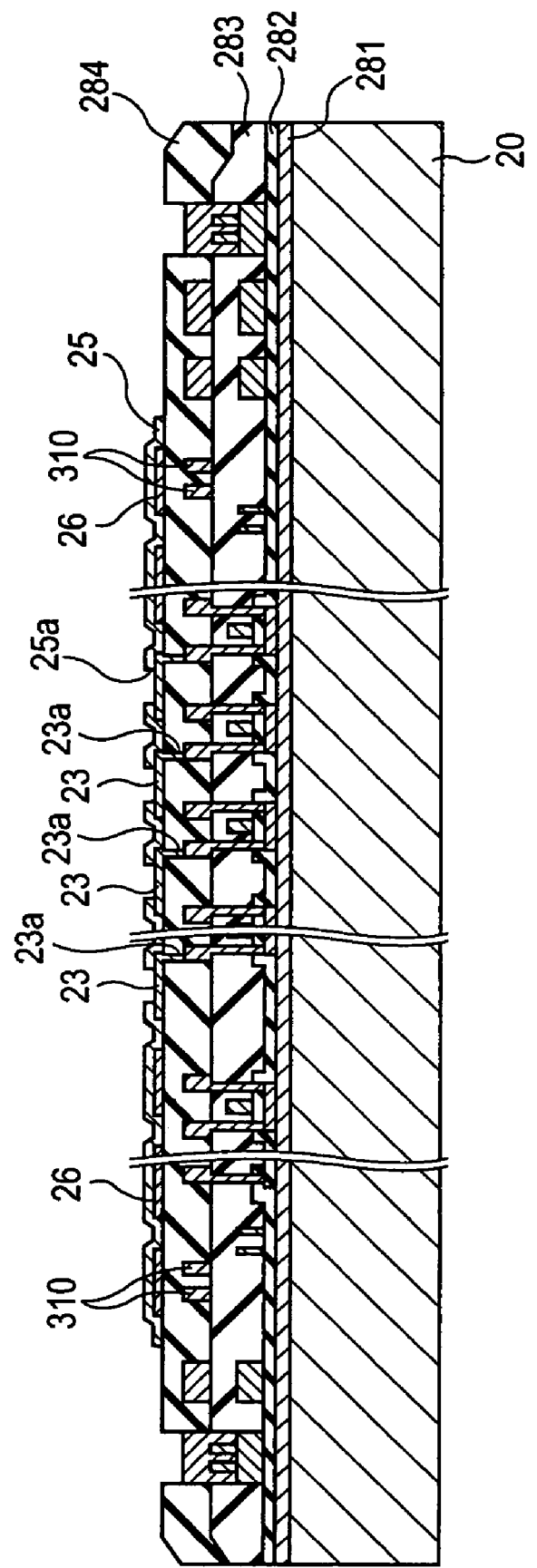

As shown in FIG. 6B, a lyophilic control layer 25 that is electrically insulative is formed over the pixel electrodes 23, the dummy patterns 26, and the insulating layer 284. The lyophilic control layer 25 has openings 25a which are also shown in FIG. 3 and which are located on the pixel electrodes 23. Holes injected from the pixel electrodes 23 migrate through the openings 25a. In the dummy patterns 26 on which the openings 25a are not present, the migration of holes is prevented because the lyophilic control layer 25 blocks the holes. A black matrix (BM), which is not shown, is formed on the lyophilic control layer 25 such that portions of the BM are disposed in recessed sections, present in the lyophilic control layer 25, located above zones between the pixel electrodes 23. In particular, the recessed sections are formed in the lyophilic control layer 25 and the BM is then formed in the recessed sections by a sputtering process using metallic chromium.

Figure 6C:
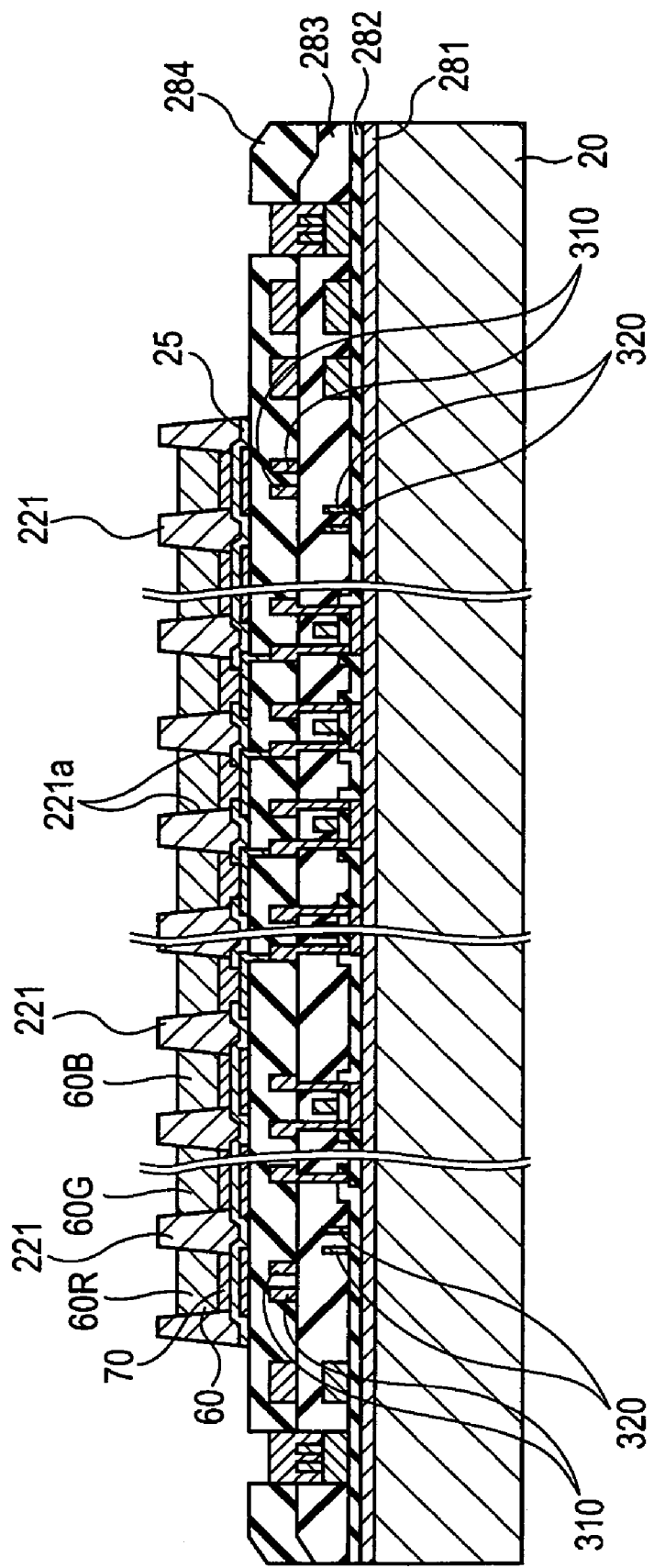

As shown in FIG. 6C, the organic partitioning layer 221 is formed over the BM and the lyophilic control layer 25. In particular, a resist such as an acrylic resin or a polyimide is dissolved in a solvent and the solution is then applied onto the BM and the lyophilic control layer 25 by a coating process such as a spin-coating process or a dip-coating process, whereby an organic layer is formed. Any material which is not dissolved in a solvent contained in ink described below and which can be readily patterned by an etching process may be used form the organic layer.

The organic layer is patterned by a photolithographic process or an etching process, whereby the openings 221a are formed in the organic layer, that is, the organic partitioning layer 221 having the openings 221a is obtained. The walls of the openings 221a make an angle of 110 to 170 degrees with the upper face of the base 200.

The organic partitioning layer 221 lies above the driving control signal-conducting sections 320.

Lyophilic regions and lyophobic regions are formed on the organic partitioning layer 221. In this embodiment, these regions are formed by plasma treatment. In particular, a step of plasma-treating the organic partitioning layer 221 includes a preheating sub-step; a sub-step of lyophilizing the upper face of the organic partitioning layer 221, the walls of the openings 221a, electrode faces 23c of the pixel electrodes 23, and portions of the upper face of the lyophilic control layer 25; a sub-step of lyophobing the upper face of the organic partitioning layer 221 and the walls of the openings 221a, and a cooling sub-step.

The hole transport layers 70 are then formed. In this step, a hole transport material is provided on the electrode faces 23c by a spin-coating process or a droplet-ejecting process such as an inkjet process and the resulting hole transport material is dried and then heated, whereby the hole transport layers 70 are each formed on the corresponding pixel electrodes 23.

The light-emitting layers 60 are then formed. In this step, a luminescent material is provided on the hole transport layers 70 by, for example, an inkjet process and the resulting luminescent material is dried and then heated, whereby the light-emitting layers 60 are each formed in the corresponding openings 221a arranged in the organic partitioning layer 221. In order to prevent the dissolution of the hole transport layers 70, a nonpolar solvent that is incompatible with the hole transport layers 70 is used in combination with the luminescent material.

Figure 7A:
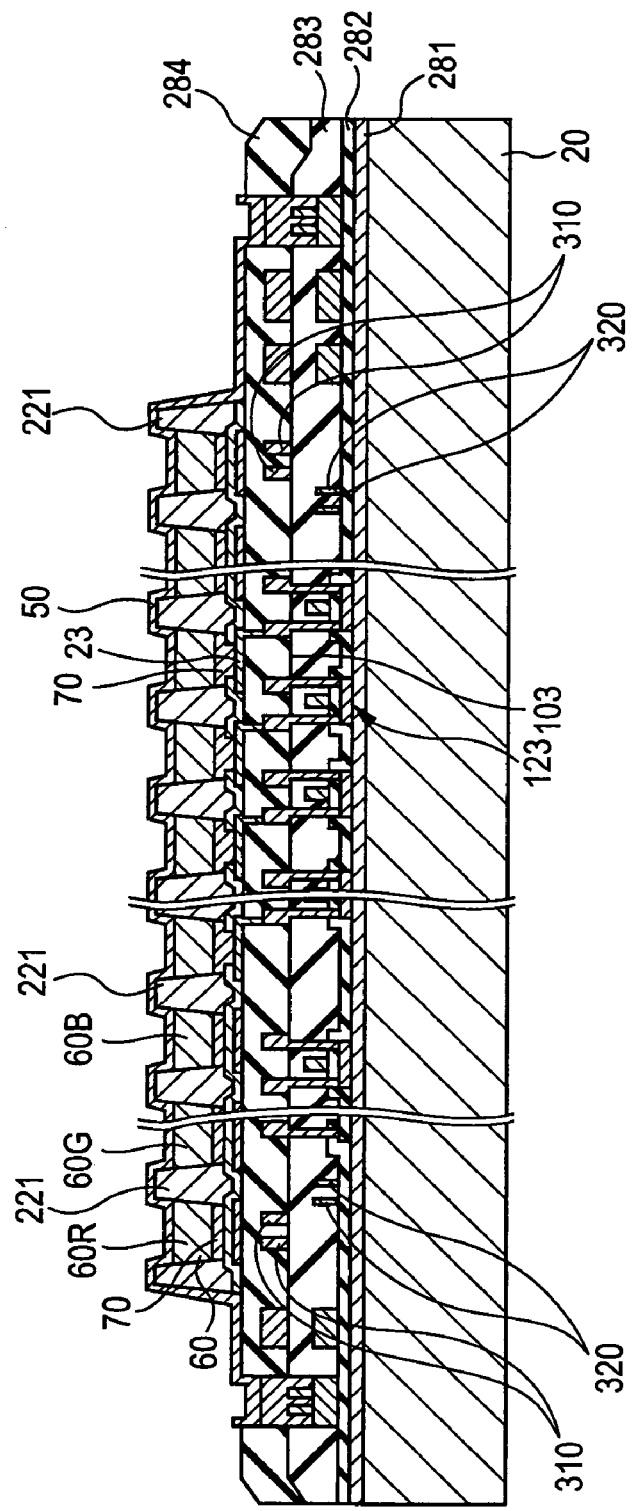
FIGS. 7A to 7C are illustrations showing steps subsequent to the step shown in FIG. 6C.

As shown in FIG. 7A, the cathode 50 is formed. In this step, an ITO layer is formed by a physical vapor deposition (PVD) process such as an ion-plating process and then processed into the cathode 50. The cathode 50 lies over the light-emitting layers 60 and the upper face and side walls of the organic partitioning layer 221.

The cathode-protecting layer 55 made of the silicon compound is formed on the cathode 50. In this step, a physical vapor deposition process such as an ion-plating process is preferably used.

Figure 7B:
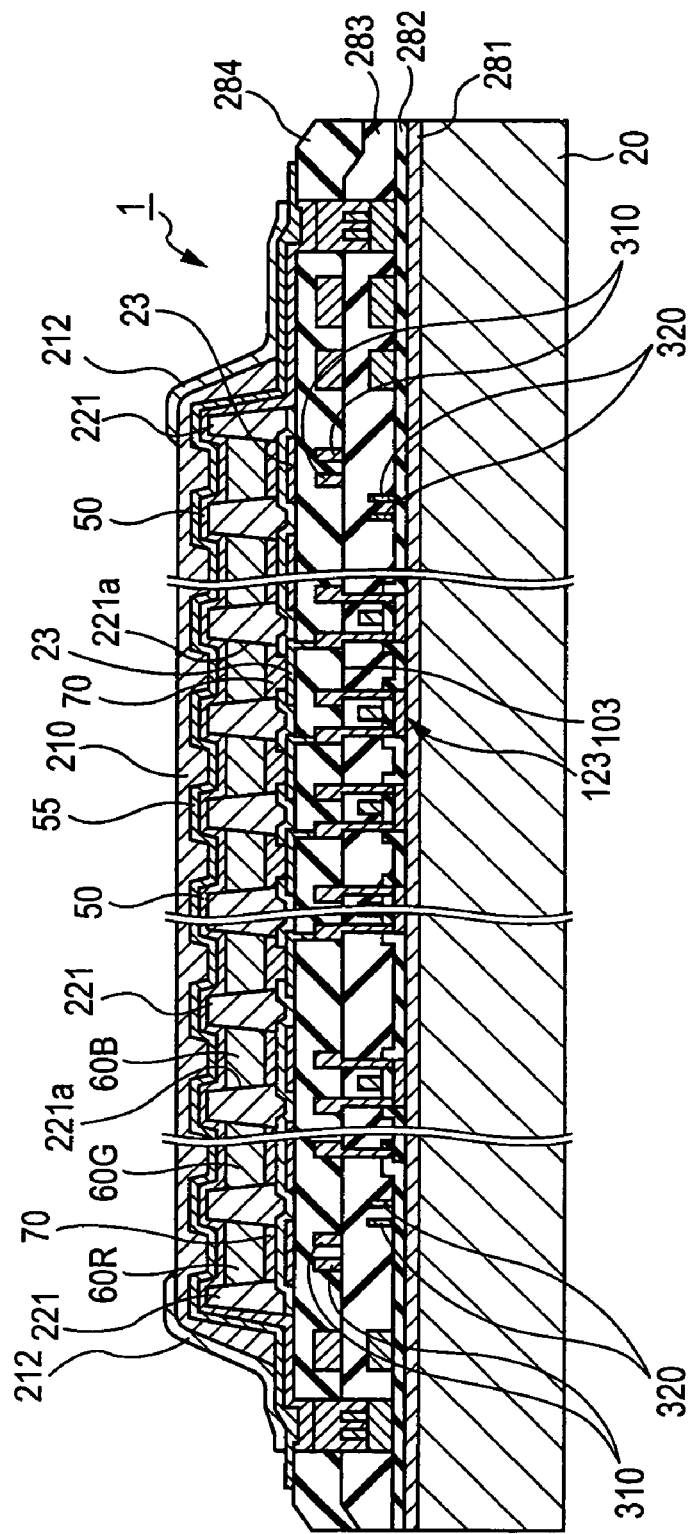

As shown in FIG. 7B, the organic buffer layer 210 is formed on the cathode-protecting layer 55 by a liquid-phase process, that is, a wet process.

Examples of such a liquid-phase process include an inkjet process, a slit-coating process, a curtain-coating process, a screen-printing process, and a flexographic process. In order to prevent the creation of layer defects due to bubbles, the pressure in a vacuum atmosphere for forming the organic buffer layer 210 is preferably 100 to 1,000 Pa.

In order to allow the organic buffer layer 210 to have good flatness and patternability compatible with each other, a mixture of raw materials of the organic buffer layer 210 preferably has a viscosity of 100 to 10,000 mPa·s. The following diluent may be used in this step: a polymerizable diluent which is hardly vaporized in such a vacuum atmosphere and which is cross-linked with a principal component of the organic buffer layer 210 during curing.

If the mixture having the above viscosity is applied onto the cathode-protecting layer 55 by one of the above processes, an end portion of the organic buffer layer 210 can make a small contact angle α with the cathode-protecting layer 55.

Since the organic buffer layer 210 must absorb the stress caused by planarization and/or irregularities, the organic buffer layer 210 must have a thickness greater than that of the organic partitioning layer 221. The thickness of the organic buffer layer 210 is preferably about 2 to 10 μm. The organic buffer layer 210 preferably has no stress and may have a small tensile stress. In order that the organic buffer layer 210 has no stress, the organic buffer layer 210 preferably has low elasticity and a density of 0.8 to 1.8 g/cm³ and is relatively porous.

In order to completely remove residual water from the organic buffer layer 210, the mixture for forming the organic buffer layer 210 is dried in a vacuum atmosphere or a dry nitrogen atmosphere at a temperature of 50° C. to 80° C. during curing. During the heating of the mixture, the mixture is not only cured but also fluidized because the viscosity thereof is decreased; hence, the organic buffer layer 210 has high flatness and the end portion of the organic buffer layer 210 has a large taper angle and a desired shape. That is, the end portion of the organic buffer layer 210 can make a contact angle α of one to 20 degrees with the cathode-protecting layer 55. In order to prevent the organic buffer layer 210 from absorbing moisture, the organic buffer layer 210 is preferably subjected to a step of forming the intermediate protective layer 212 without exposing the organic buffer layer 210 to air.

The step of forming the organic buffer layer 210 in a vacuum by the screen-printing process will now be described in detail.

FIGS. 8A to 8K are illustrations showing sub-steps in the screen-printing process.

The screen-printing process can be used under vacuum conditions and is therefore suitable for the use of a coating solution with medium or relatively high viscosity. In particular, the screen-printing process has an advantage that such a coating solution can be readily controlled by the movement of a squeegee pressed against a mesh screen and a layer having uniform thickness and good patternability can be obtained by the use of the mesh screen.

Figure 8A:
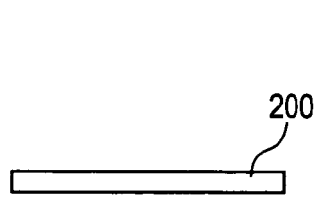
FIGS. 8A to 8K are illustrations showing steps in a screen-printing process.

As shown in FIG. 8A, the base 200 including the cathode-protecting layer 55 is placed into a first substrate-transfer chamber (not shown), the pressure in the first substrate-transfer chamber is reduced to a predetermined value, the pressure in a printing chamber (not shown) is reduced to a predetermined value, and the base 200 is transferred into the resulting printing chamber.

Figure 8B:
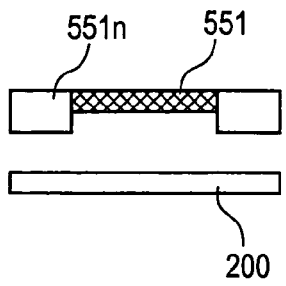

As shown in FIG. 8B, the base 200 is then aligned with a mesh screen 551. The mesh screen 551 has a non-coating section, including a cured emulsion layer 55 in that is lyophobic, for covering an uncoated area.

The mesh screen 551 has a pattern for forming the organic buffer layer 210 such that an end portion of the organic buffer layer 210 has a predetermined shape, for example, a wavy shape.

After the alignment is performed, the base 200 is fixed on a stage (not shown) by, for example, vacuum aspiration.

Figure 8C:
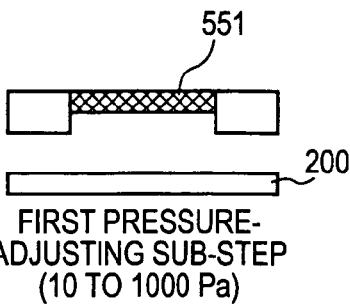

As shown in FIG. 8C, a first pressure-adjusting sub-step is performed such that the pressure in the printing chamber is adjusted to 10 to 1,000 Pa before an organic buffer layer-forming material K for forming the organic buffer layer 210 is applied dropwise onto the mesh screen 551.

Figure 8D:
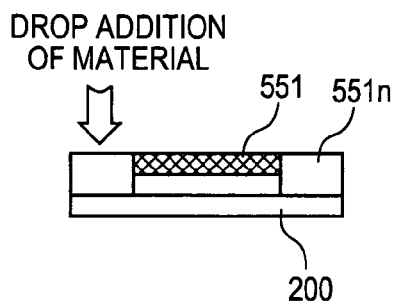

As shown in FIG. 8D, a predetermined amount of the uncured organic buffer layer-forming material K is applied onto an outer region of the mesh screen 551, that is, the cured emulsion layer 551n, with a dispensing nozzle or the like.

The organic buffer layer-forming material K contains the epoxy monomers or oligomers, the curing agent, the reaction accelerator as described above. These compounds are mixed before the use of the organic buffer layer-forming material K. The organic buffer layer-forming material K preferably has a viscosity of 500 to 20,000 mPa·s at room temperature, for example, 25° C. If the viscosity thereof is less than 500 mPa·s, the organic buffer layer-forming material K overflows the mesh screen 551 or flows over the cured emulsion layer 551n; hence, a layer of the organic buffer layer-forming material K will have uneven thickness and/or unsatisfactory patternability. In contrast, if the viscosity thereof is greater than 20,000 mPa·s, a trace of the mesh screen 551 remains on this layer, which therefore has poor flatness. Furthermore, bubbles are caught in this layer during the removal of the mesh screen 551 and then greatly grow; hence, uncoated portions with a crater shape will remain in this layer and the bubbles will remain therein after this layer is defoamed.

The organic buffer layer-forming material K more preferably has a viscosity of 2,000 to 10,000 mPa·s at room temperature. When the viscosity thereof is 10,000 mPa·s or less, the bubbles are prevented from remaining in this layer. When the viscosity thereof is 2,000 mPa·s or more, bubbles are prevented from cracking during screen-printing; hence, this layer is uniform. Furthermore, dark spots described below can be prevented from being created. That is, if the viscosity of the organic buffer layer-forming material K is adjusted within the above range, the organic buffer layer 210 will have a desired shape and good surface flatness, the bubbles can be minimized, and the angle between the end portion of the organic buffer layer 210 and the cathode-protecting layer 55 can be reduced. This prevents the creation of the dark spots.

In order to absorb the stress caused by the planarization and the irregularities, the organic buffer layer 210 must have a thickness greater than that of the organic partitioning layer 221. Since the organic partitioning layer 221 has a thickness of 2 to 5 μm as described above, the organic buffer layer 210 preferably has a thickness of about 3 to 10 μm. The adjustment of the viscosity and the thickness impacts the contact angle α and is critical in order that the contact angle α is 45 degrees or less as described above. The organic buffer layer 210 preferably has no stress and may have a small tensile stress. In order that the organic buffer layer 210 has no stress, the organic buffer layer 210 preferably has an elasticity of 1 to 10 GPa and a density of 0.8 to 1.8 g/cm$^3$ and is preferably porous as described above.

Figure 8E:
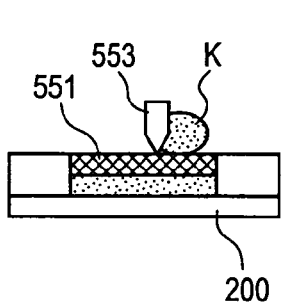

As shown in FIG. 8E, a squeegee 553 is moved on the mesh screen 551 from one side thereof to the other side, whereby the organic buffer layer-forming material K is spread over the mesh screen 551 and applied onto the base 200. This transfers the pattern of the mesh screen 551 onto the base 200. When the base 200 is aligned with the mesh screen 551, the base 200 may be directly brought into contact with the mesh screen 551 or spaced apart from the mesh screen 551 by about 1 mm. If the base 200 is slightly spaced from the mesh screen 551, the base 200 can be substantially brought into contact with the mesh screen 551 with the organic buffer layer-forming material K disposed therebetween. This is referred to as contact screen printing. The mesh screen 551 must be removed from the base 200 in a subsequent step below.

Figure 8F:
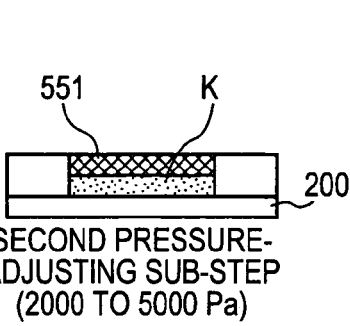

Since the organic buffer layer-forming material K is applied onto the base 200 in such a manner that the organic buffer layer-forming material K is rolled, bubbles are caught in the organic buffer layer-forming material K. Therefore, as shown in FIG. 8F, a second pressure-adjusting sub-step is performed such that the pressure in the printing chamber is adjusted to 2,000 to 5,000 Pa and maintained for a predetermined time, whereby the bubbles are removed. In particular, nitrogen gas is introduced into the printing chamber, whereby the pressure in the printing chamber is increased from the range of 10 to 1,000 Pa to the range of 2,000 to 5,000 Pa. Since the bubbles are caused by low pressure, the bubbles can be eliminated by increasing the pressure in the printing chamber.

Figure 8G:
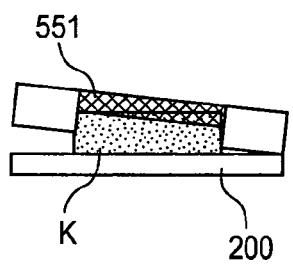

As shown in FIG. 8G, the mesh screen 551 is removed from the base 200. In this step, the stage, which is not shown, is moved downward in such a manner that the squeegee 553 is pressed against a portion of the mesh screen 551 that is located close to one side of the base 200, whereby a portion of the mesh screen 551 that is opposed to the portion in contact with the squeegee 553 is separated from the base 200 and the mesh screen 551 is entirely separated from the base 200. When the mesh screen 551 is removed from the base 200, the pressure in the printing chamber is preferably adjusted to 3,000 to 4,000 Pa. During the removal of the mesh screen 551, since the base 200 is pulled by the mesh screen 551, a large force is applied to the base 200 such that the base 200 is separated from the stage. However, since the pressure in the printing chamber is 3,000 to 4,000 Pa, the base 200 is securely fixed on the stage by vacuum aspiration and the mesh screen 551 can be removed from the base 200 without any problems.

Figure 8H:
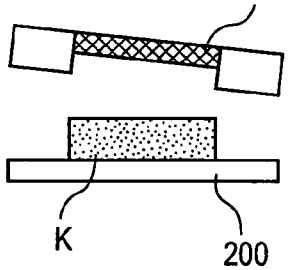

As shown in FIG. 8H, the stage is further moved downward. After the mesh screen 551 is completely removed from the base 200, this step is finished.

Figure 8I:
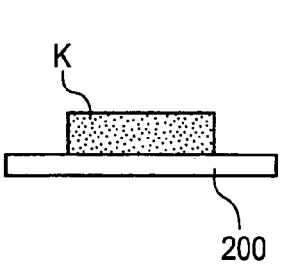
Figure 8J:
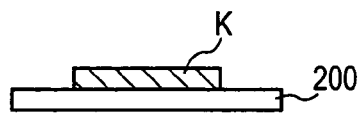

As shown in FIG. 8I, the base 200 coated with the organic buffer layer-forming material K is transferred into a second substrate-transfer chamber (not shown). As shown in FIG. 8J, a third pressure-adjusting sub-step is performed such that the pressure in the second substrate-transfer chamber in which the base 200 is placed is adjusted to an atmospheric pressure and maintained for a predetermined time, whereby the creation of bubbles is prevented. In particular, nitrogen gas is introduced into the second substrate-transfer chamber, whereby the pressure in the second substrate-transfer chamber is increased from the range of 2,000 to 5,000 Pa to an atmospheric pressure.

Figure 8K:
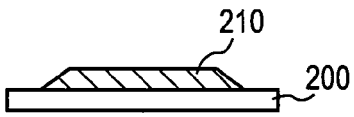

As shown in FIG. 8K, after the base 200 is transferred from the second substrate-transfer chamber to a heating chamber (not shown), the layer of the organic buffer layer-forming material K is heat-treated at a temperature of 60° C. to 100° C., whereby the layer of the organic buffer layer-forming material K is cured. In this curing sub-step, the epoxy monomers or oligomers, the curing agent, the reaction accelerator contained in the organic buffer layer-forming material K are allowed to react with each other and the epoxy monomers or oligomers are therefore three-dimensionally cross-linked, whereby epoxy polymers are formed.

Since the layer of the organic buffer layer-forming material K is heated, an end portion of the layer of the organic buffer layer-forming material K sags and has an edge angle of 20 degrees or less as shown in FIG. 5. This leads to the formation of the organic buffer layer 210 having a predetermined shape.

With reference back to FIG. 7B, the intermediate protective layer 212 is formed on an outer region of the organic buffer layer 210 or formed over the organic buffer layer 210. A PVD process such as a vacuum vapor deposition process or a sputtering process is preferably used to form the organic buffer layer 210.

The first magnetic layer 21 is preferably made of aluminum, lithium fluoride, or sodium fluoride. This is because these materials can be vaporized at relatively low temperature and are chemically stable, inexpensive, and suitable for large-scale production.

Figure 7C:
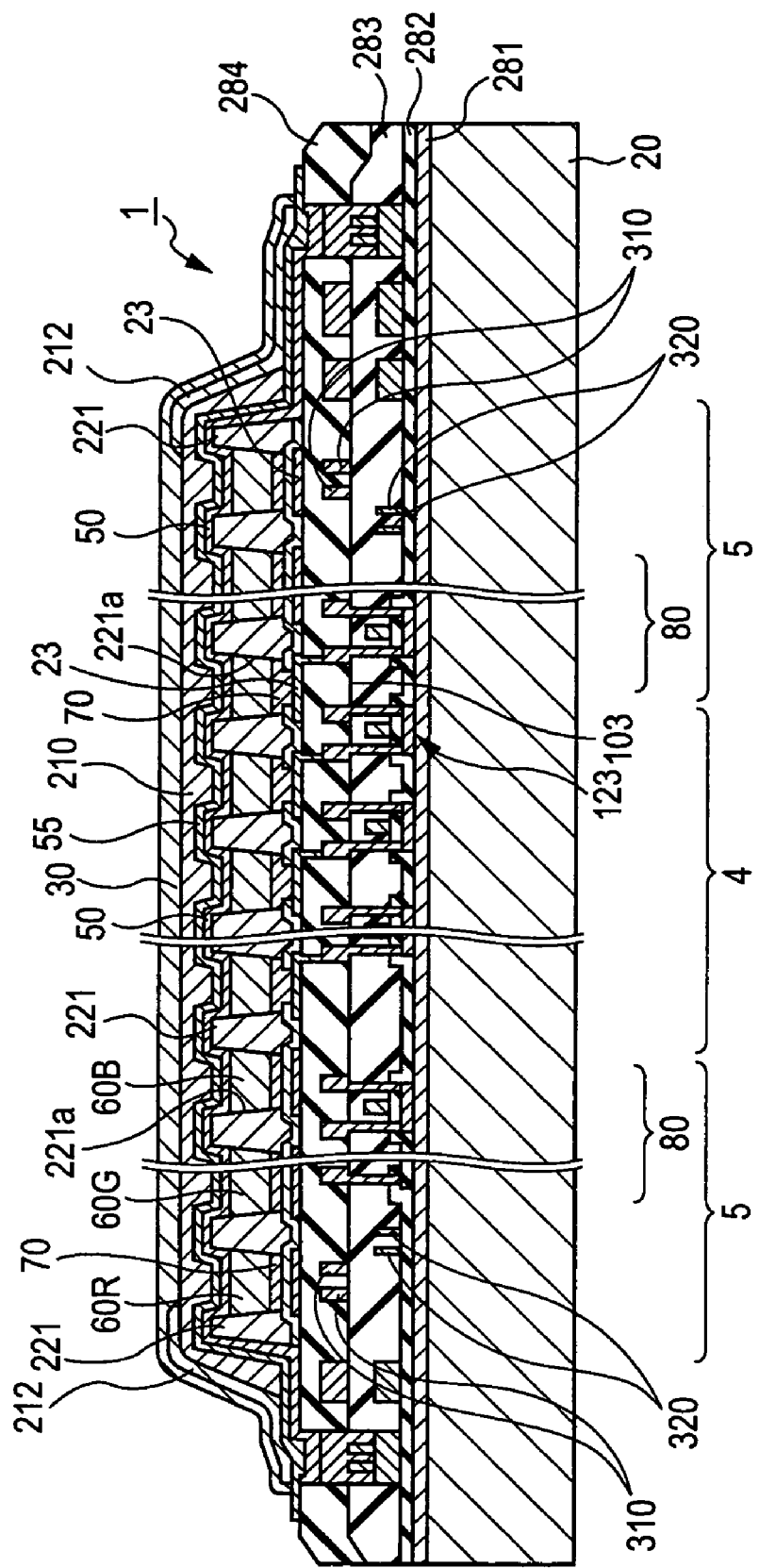

As shown in FIG. 7C, the gas barrier layer 30 is formed over the intermediate protective layer 212 under vacuum conditions by a high-density plasma deposition process or another process. The gas barrier layer 30 is preferably made of silicon nitride or silicon nitride oxide so as to be transparent. The gas barrier layer 30 is preferably dense so as to block moisture with a small molecular size and may have low compression stress. The gas barrier layer 30 preferably has a density of 2.3 g/cm$^3$ or more. The sum of the thickness of the gas barrier layer 30 and that of the intermediate protective layer 212 is preferably 1,000 nm or less and more preferably 50 to 500 nm.

In order to form the intermediate protective layer 212 and the gas barrier layer 30, a PVD such as sputtering process or an ion-plating process may be used prior to a chemical vapor deposition (CVD) process such as a plasma-enhanced CVD process. The PVD process is usually useful in forming a layer on a substrate incompatible to this layer such that this layer is tightly joined to this substrate; hence, the PVD process is suitable for forming the intermediate protective layer 212 and the gas barrier layer 30. On the other hand, the CVD process is usually useful in forming a layer which has low stress, good step coverage, and slight defects and which is dense; hence, the CVD process is suitable for forming the gas barrier layer 30. These processes may be properly selected in view of large-scale production.

The gas barrier layer 30 is formed subsequent to the formation of the intermediate protective layer 212 in a vacuum without exposing the gas barrier layer 30 to an air atmosphere. Alternatively, the gas barrier layer 30 and the intermediate protective layer 212 may be formed in the same chamber in such a manner that different deposition regions are selected using different masks and different gases are used or the ratio of different gases is continuously changed. According to this manner, no clear interface is present between the intermediate protective layer 212 and the gas barrier layer 30 although the intermediate protective layer 212 and the gas barrier layer 30 contain different components and have different compositions and elasticities. That is, the following layer can be formed: a layer having the same functions as those of the gas barrier layer 30 and the intermediate protective layer 212.

The gas barrier layer 30 may be made of a single material and has a single-layer structure or may include a plurality of sub-layers made of different materials. Alternatively, the composition of the gas barrier layer 30 may be varied continuously or stepwise in the thickness direction if the gas barrier layer 30 has such a single-layer structure.

The protective layer 204, including the adhesive sub-layer 205 and the surface-protecting substrate 206, shown in FIGS. 3 and 4 is provided on the gas barrier layer 30. In particular, the adhesive sub-layer 205 is formed on the gas barrier layer 30 by a screen-printing process, a slit-coating process, or another process so as to have substantially uniform thickness and the surface-protecting substrate 206 is then joined to the adhesive sub-layer 205.

Since the protective layer 204 is disposed on the gas barrier layer 30 and the surface-protecting substrate 206 has pressure resistance, abrasion resistance, the ability to prevent the reflection of external light, the ability to block gas, and/or the ability to block UV light, the surface-protecting substrate 206 can protect the light-emitting layers 60, the cathode 50, and the gas barrier layer 30. This leads to an increase in the life of the light-emitting elements.

The adhesive sub-layer 205 has a function of absorbing mechanical shocks. Therefore, if such mechanical shocks are applied to the adhesive sub-layer 205 from outside, the gas barrier layer 30 and the light-emitting elements arranged therebelow can be protected from the mechanical shocks; hence, the light-emitting elements can be prevented from being damaged due to the mechanical shocks.

The EL display device 1 can be obtained by the above procedure.

Figure 9:
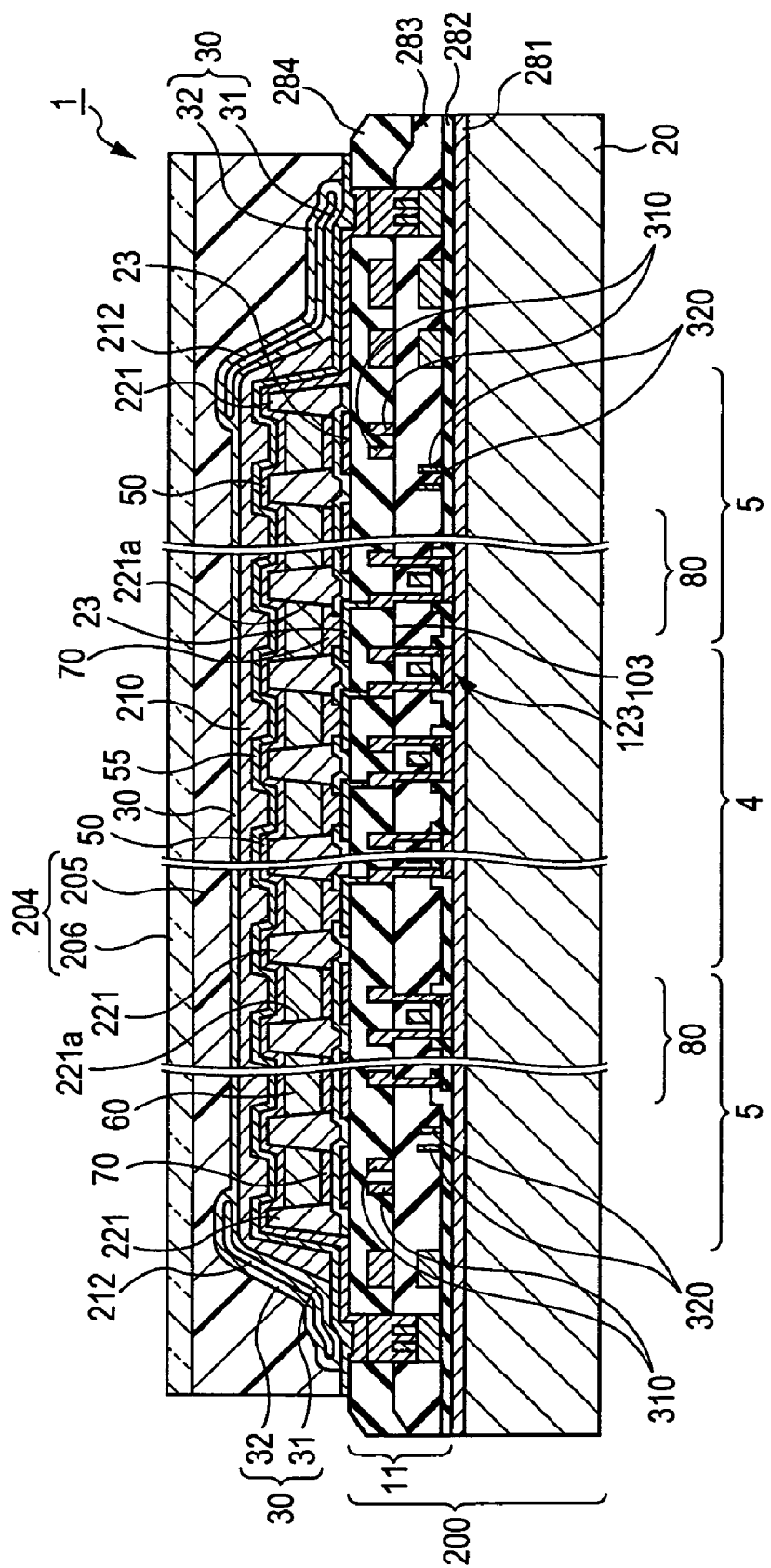
FIG. 9 is a sectional view of a modification of the EL display device 1.
Figure 10A:
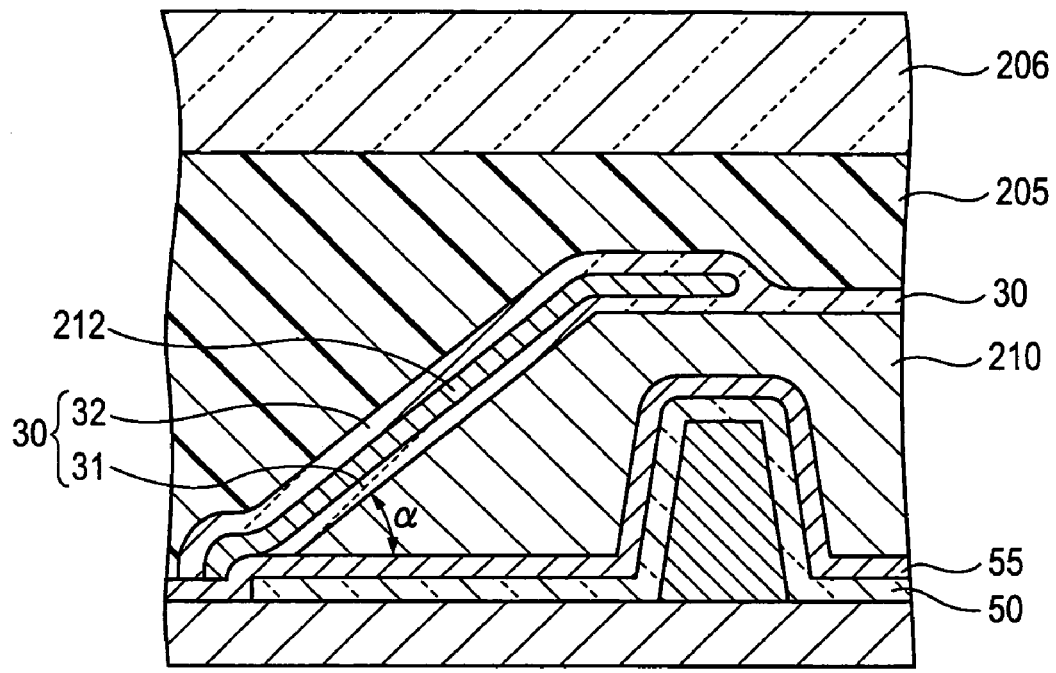
FIGS. 10A and B are enlarged views of end portions (outer regions) of an organic buffer layer 210 included in the modification.
Figure 10B:
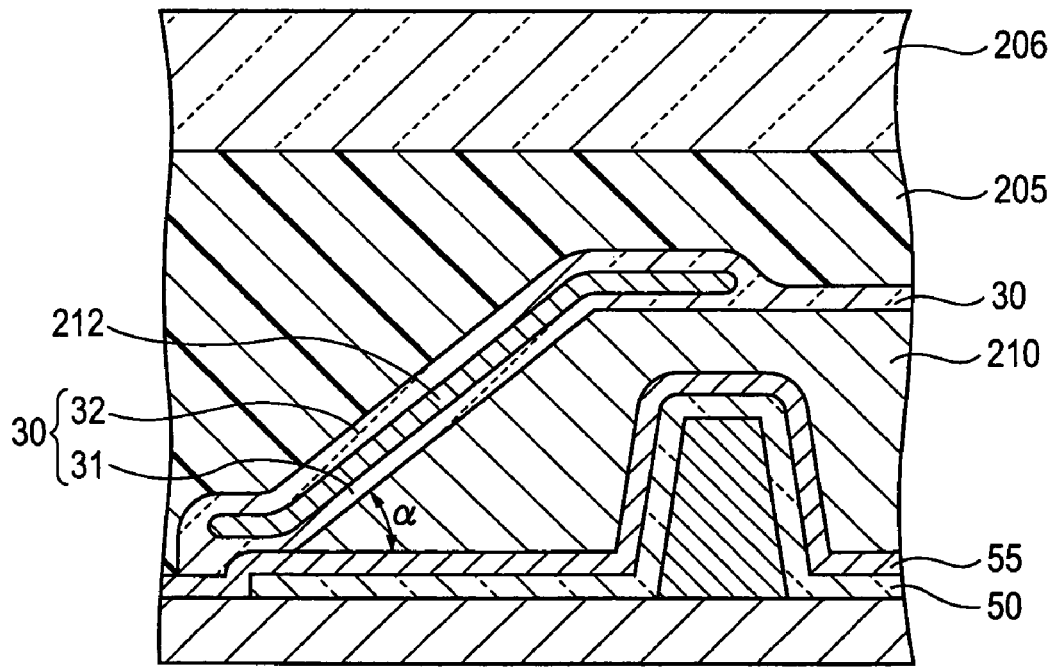

FIGS. 9, 10A, and 10B are illustrations showing a modification of the EL display device 1.

AS shown in FIG. 9, the modification includes a gas barrier layer 30 including a first gas barrier sub-layer 31 and a second gas barrier sub-layer 32. An intermediate protective layer 212 may be sandwiched between the first and second gas barrier sub-layer 31 and 32. That is, this intermediate protective layer 212 may be disposed in this gas barrier layer 30.

In the modification, this intermediate protective layer 212 may be in contact with a cathode-protecting layer 55 included in a base 200 as shown in FIG. 10A or may be embedded in this gas barrier layer 30 such that this intermediate protective layer 212 is spaced apart from this cathode-protecting layer 55 as shown in FIG. 10B. In both cases, this intermediate protective layer 212 is not exposed to outside and is therefore protected from moisture and/or oxygen.

The modification further includes an organic buffer layer 210 having an end portion, which is in contact with this cathode-protecting layer 55 and makes a contact angle α with upper face of this cathode-protecting layer 55. The contact angle α is preferably 45 degrees or less and more preferably one to 20 degrees.

Since this organic buffer layer 210 has such a configuration, this intermediate protective layer 212 and this gas barrier layer 30 follow the shape of this organic buffer layer 210. Therefore, the gas barrier layer 30 has an end portion that is not sharply sloped but gently sloped. This prevents this gas barrier layer 30 from being damaged or cracked due to stress concentration.

In particular, the end portion (outer region) of this gas barrier layer 30 that is easily cracked is disposed on this organic buffer layer 210 with this intermediate protective layer 212 disposed therebetween; hence, this gas barrier layer 30 can be securely prevented from being damaged or cracked due to stress concentration. Therefore, the sealing ability of this gas barrier layer 30 can be maintained for a long time.

Second Embodiment

An EL display device 2 according to a second embodiment of the invention will now be described. In this embodiment, the same components as those described in the first embodiment have the same reference numerals as those described in the first embodiment in order to omit the descriptions thereof.

Figure 11:
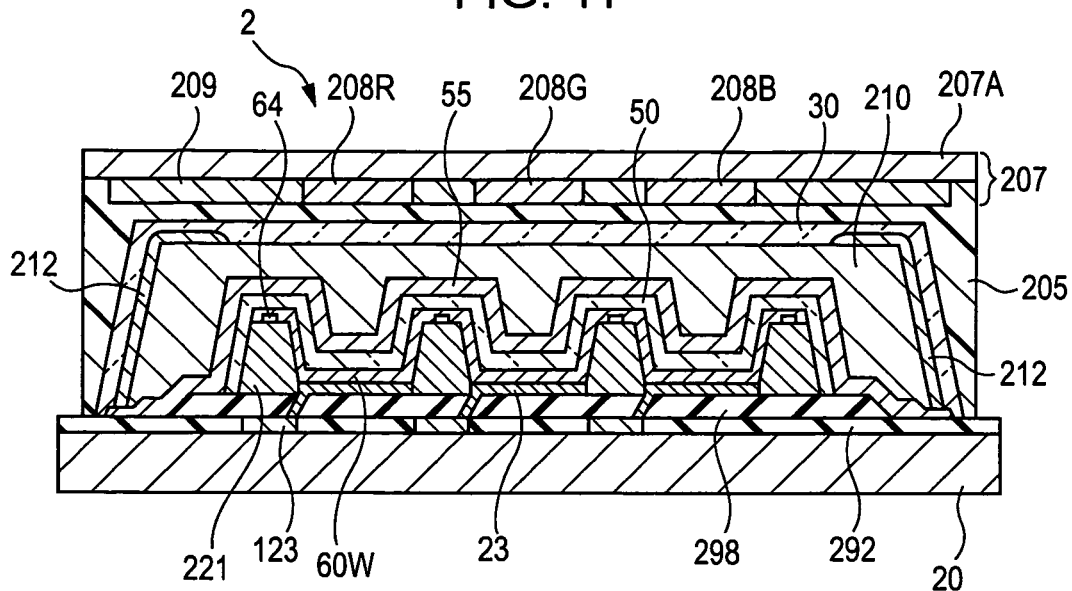
FIG. 11 is a schematic sectional view of an EL display device 2 according to a second embodiment of the invention.
Figure 12:
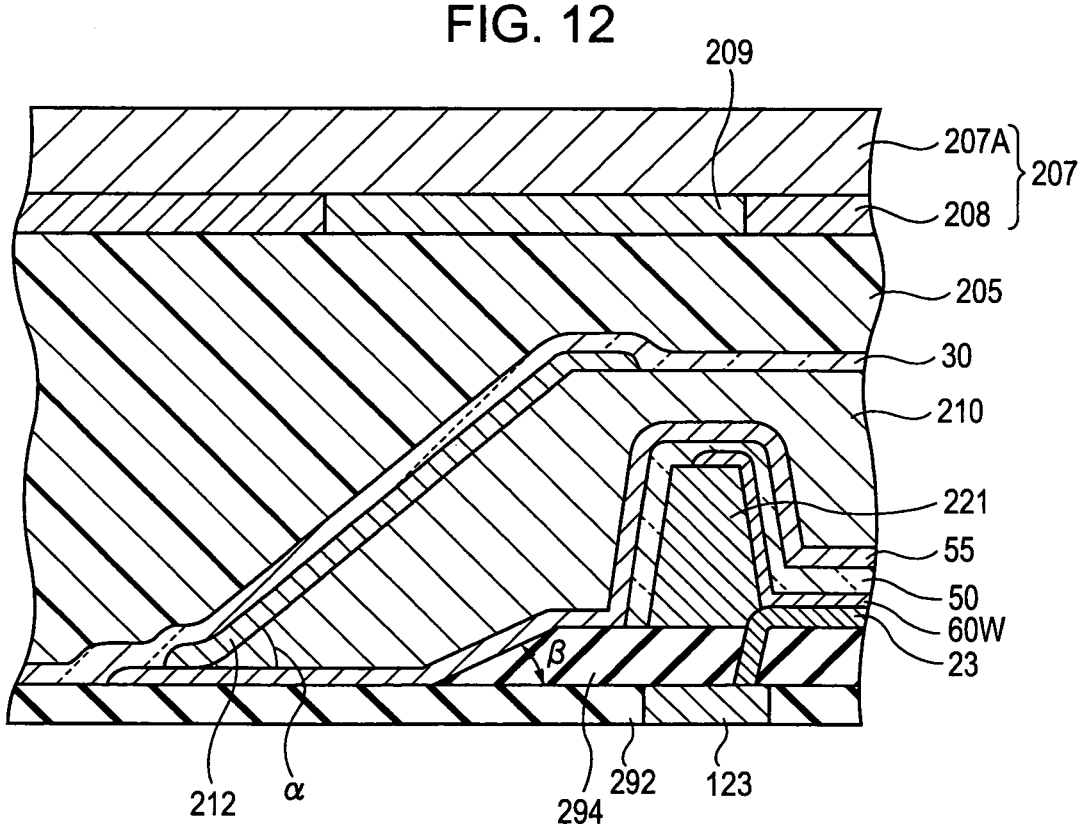
FIG. 12 is an enlarged view of an end portion (an outer region) of an organic buffer layer 210.

FIG. 11 is a schematic sectional view of the EL display device 2. FIG. 12 is an enlarged view of an end portion (an outer region) of an organic buffer layer 210 included in the EL display device 2.

The EL display device 2 is different from the EL display device 1 of the first embodiment in that the EL display device 2 includes white light-emitting layers 60W and a color filter substrate 207 serving as a surface protection substrate.

The white light-emitting layers 60W are made of a white organic luminescent material such as a styrylamine-based luminescent material, an anthracene-based dopant (blue), or a rubrene-based dopant (yellow).

The following layers are preferably disposed on or under the white light-emitting layers 60W: triarylamine (ATP) oligomer hole injection layers, triphenyldiamine (TPD) hole transfer layers, aluminum quinolinol (Alq3) electron transfer layers, and/or LiF electron injection buffer layers.

The white light-emitting layers 60W may straddle an organic partitioning layer 221 to extend over the pixel electrodes 23 because the white light-emitting layers 60W need not be partitioned into red groups, green groups, and blue groups unlike the light-emitting layers 60 included in the EL display device 1 of the first embodiment.

The EL display device 2 may include an auxiliary electrode 64 disposed on the organic partitioning layer 221. The auxiliary electrode 64 has a resistance less than that of a cathode 50 and is electrically connected to intermediate portions of the cathode 50 so as to prevent a voltage drop occurring in the cathode 50.

The color filter substrate 207 includes a substrate body 207A, red-colored layers 208R, green-colored layers 208G, blue-colored layers 208B, and a black matrix 209, these components being arranged on the substrate body 207A. The red-, green-, and blue-colored layers 208R, 208G, and 208B and the black matrix 209 are opposed to a base 200 with an adhesive layer 205 disposed on the base 200. The substrate body 207A may be made of the same material as that for forming the surface-protecting substrate 206 described in the first embodiment.

The red-, green-, and blue-colored layers 208R, 208G, and 208B are each opposed to the corresponding white light-emitting layers 60W. Therefore, lights emitted from the white light-emitting layers 60W each pass through the corresponding red-, green-, and blue-colored layers 208R, 208G, and 208B. This allows red lights, green lights, and blue lights to be emitted from the EL display device 2 toward observers.

Since the EL display device 2 includes the color filter substrate 207 including the red-, green-, and blue-colored layers 208R, 208G, and 208B, the EL display device 2 can display a color image using the lights emitted from the white light-emitting layers 60W.

The distance between each white light-emitting layer 60W and each of the red-, green-, and blue-colored layers 208R, 208G, and 208B is preferably small such that the lights emitted from the white light-emitting layers 60W are each applied to the corresponding red-, green-, and blue-colored layers 208R, 208G, and 208B. This is because if the distance therebetween is large, a light emitted from one of the white light-emitting layers 60W will be applied to one of the red-, green-, and blue-colored layers 208R, 208G, and 208B that is adjacent to one directly located above the white light-emitting layer 60W.

In particular, the distance between the color filter substrate 207 and an insulating layer 284 is preferably about 15 μm. This allows the lights emitted from the white light-emitting layers 60W to be each applied to the corresponding red-, green-, and blue-colored layers 208R, 208G, and 208B. That is, a light emitted from one of the white light-emitting layers 60W can be prevented from being applied to one of the red-, green-, and blue-colored layers 208R, 208G, and 208B that is adjacent to one directly located above the white light-emitting layer 60W. Therefore, color mixing can be prevented from occurring.

Since the white light-emitting layers 60W emit single-color lights, the white light-emitting layers 60W need not be partitioned into such red groups, green groups, and blue groups. Therefore, the white light-emitting layers 60W can be more readily formed than red, green, and blue light-emitting layers that are separately formed, because the white light-emitting layers 60W can be formed in one step by a mask vapor deposition process using a low-molecular-weight compound or by a droplet ejection process using a polymer. Furthermore, the difference in life between the white light-emitting layers 60W is small.

With reference to FIG. 12, the EL display device 2 further includes an intermediate protective layer 212 and a gas barrier layer 30 disposed between the intermediate protective layer 212 and the organic buffer layer 210.

The organic buffer layer 210 lies on the cathode-protecting layer 55 and has an end portion that makes a contact angle α with the upper face of the cathode-protecting layer 55. The contact angle α is preferably 45 degrees or less and more preferably one to 20 degrees.

Therefore, the gas barrier layer 30 disposed on the organic buffer layer 210 has an end portion that is not sharply sloped but gently sloped. This prevents the gas barrier layer 30 from being damaged or cracked due to stress concentration. Hence, the sealing ability of the gas barrier layer 30 can be maintained for a long time.

The EL display device 2 further includes an interlayer insulating layer 292 and a planarized insulating layer 294 that make a contact angle β of 45 degrees or less. Therefore, a portion of the cathode-protecting layer 55 that is disposed on the planarized insulating layer 294 is gently sloped.

Thus, the cathode-protecting layer 55 can be prevented from being damaged or cracked due to stress concentration.

EXAMPLES

Problems caused in EL display devices will now be described. The EL display devices include organic buffer layers 210, gas barrier layers 30, and intermediate protective layers 212 each disposed therebetween.

FIG. 13 is a table showing the problems.

The EL display devices, including the intermediate protective layer 212 made of various materials, similar to the above EL display devices 1 and 2 were prepared and then subjected to a thermal cycle test or a high-humidity test. The EL display devices were evaluated if the gas barrier layers 30 had end portions (outer regions) penetrated by moisture.

The EL display devices included pixel electrodes 23 with a thickness of 100 nm; white light-emitting layers 60W with a thickness of 150 nm; cathodes 50 with a thickness of 15 nm; cathode-protecting layers 55, made of SiON, having a thickness of 100 nm; and protective layers 204 with a thickness of 100 μm. The organic buffer layers 210 had a thickness of 5 μm and the gas barrier layers 30 were made of SiON and had a thickness of 400 nm.

In the thermal cycle test, some of the EL display devices were treated at −40° C. for 30 minutes and then 85° C. for 30 minutes for 300 cycles. In the high-humidity test, some of the EL display devices were treated at 85° C. for 500 hours in an atmosphere having a relative humidity of 85%.

As is clear from FIG. 13, in the EL display devices which are examples of the invention and which include the intermediate protective layers 212 made of an alkali halide such as LiF or MgF or an inorganic material such as Mg, Zn, Al, Ag, or $SiO_2$, the gas barrier layers 30 have no end portions (outer regions) penetrated by moisture. These materials have an elasticity of 10 to 100 GPa.

In the EL display devices which are comparative examples and which include no intermediate protective layer 212 or include the intermediate protective layers 212 made of an inorganic material such as Ti, Pt, MgO, $Si_3N_4$, or $Al_2O_3$, the gas barrier layers 30 have end portions (outer regions) penetrated by moisture. These materials have an elasticity of more than 100 GPa.

In the EL display devices which are the examples of the invention, since the intermediate protective layers 212 are disposed between the organic buffer layers 210 and the gas barrier layers 30, the thermal distortion (expansion or shrinkage) of the organic buffer layers 210 is not directly transmitted to the gas barrier layers 30; hence, the gas barrier layers 30 can be prevented from being cracked. In particular, although the end portions (outer regions) of the gas barrier layers 30 are easily damaged or cracked, the creation of defects such as cracks in the gas barrier layers 30 can be effectively prevented by the presence of the intermediate protective layers 212.

In the above embodiments, the EL display devices 1 and 2 are of the top emission type. However, an EL display device according to the invention is not limited to the top emission type and may be of the bottom emission type or a both-sided emission type.

Figure 14:
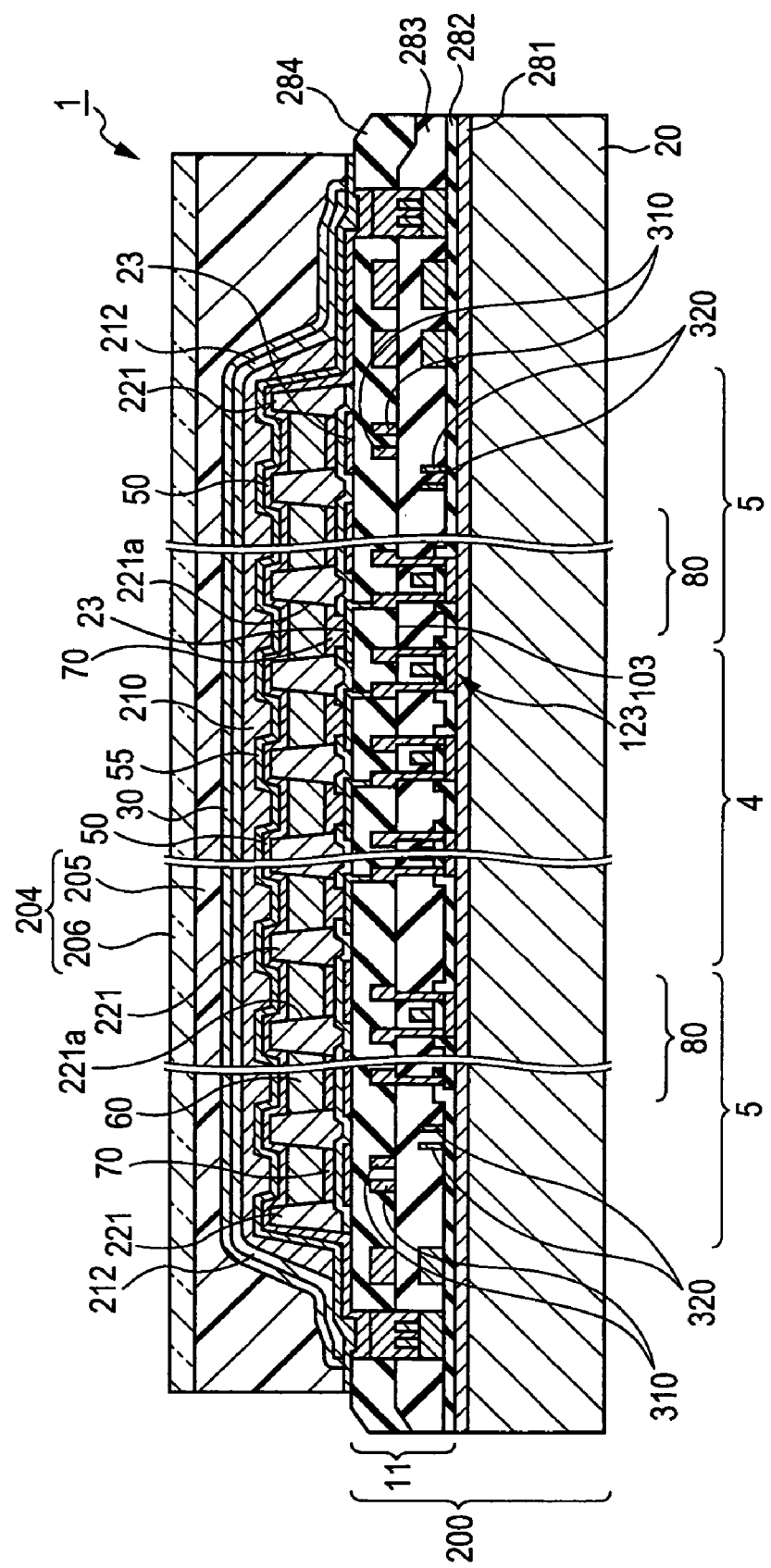
FIG. 14 is a sectional view of a bottom emission-type EL display device.
Figure 15:
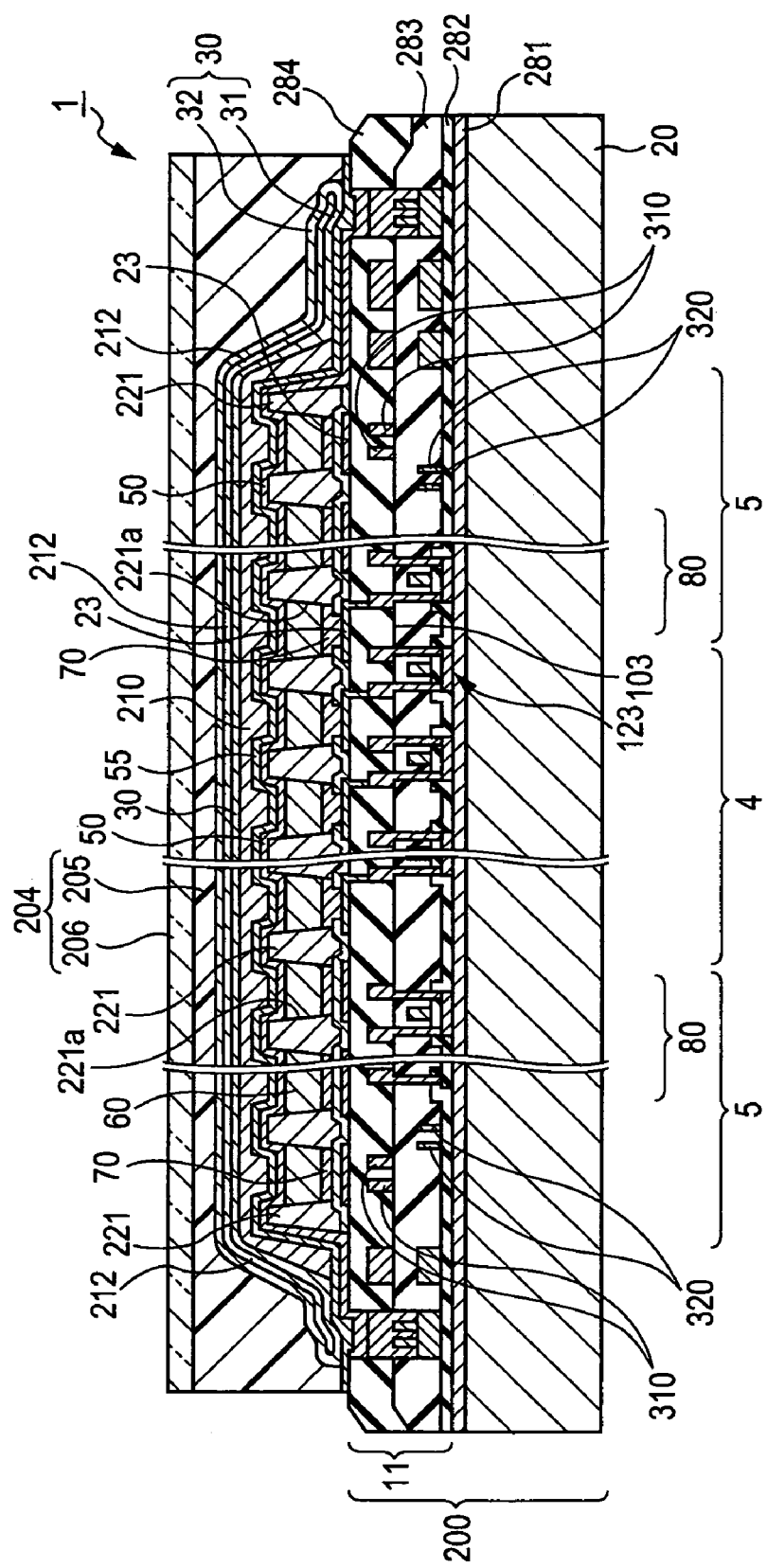
FIG. 15 is a sectional view of another bottom emission-type EL display device.

FIGS. 14 and 15 show bottom emission-type EL display devices including intermediate protective layers 212 and organic buffer layers 210. The intermediate protective layers 212 have no opening and entirely cover the organic buffer layers 210.

In a bottom emission- or top emission-type EL display device, an intermediate protective layer 212 which is made of lithium fluoride and which is therefore transparent may entirely cover an organic buffer layer 210.

In a bottom emission- or both-sided emission-type EL display device, it is preferable that switching TFTs 112 and/or driving TFTs 123 arranged in a base 200 be not directly located below light-emitting elements but be directly located below a lyophilic control layer 25 or an organic partitioning layer 221. This leads to an increase in aperture.

The EL display devices 1 and 2 of the above embodiments each include the pixel electrodes 23 and the cathode 50 as described above. The pixel electrodes 23 and the cathode 50 correspond to first electrodes and a second electrode, respectively, specified in at least one of the claims. The EL display devices 1 and 2 may each include a first electrode serving as an anode and second electrodes serving as cathodes. In this case, the light-emitting layers 60 must be disposed under the hole transport layers 70.

The EL display devices 1 and 2 are merely examples of a light-emitting device according to the invention. The invention is not limited to the embodiments and it should be construed that the invention covers any light-emitting device including a base and a second electrode disposed outside the base.

The organic buffer layers 210, the intermediate protective layers 212, and the gas barrier layers 30 included in the EL display devices 1 and 2 can be measured for elasticity by a nanoindentation technique.

The nanoindentation technique is as follows: a penetrator is introduced into a sample in such a manner that the penetrator is precisely controlled, a stress-strain curve of the sample is prepared, and mechanical properties of the sample, for example, the hardness and elasticity thereof, are determined by the analysis of the curve. Thin-film samples cannot be measured for mechanical properties by a known test technique; however, the nanoindentation technique can be used to measure such samples for mechanical properties. Since the reproducibility of the nanoindentation technique is high, the nanoindentation technique is can be used to measure the intermediate protective layers 212 and other components for elasticity.

Third Embodiment

An electronic apparatus according to a third embodiment of the invention will now be described.

The electronic apparatus includes a display section similar to the EL display device 1 or 2 according to the first or second embodiment. FIGS. 16A to 16D show examples of the electronic apparatus.

Figure 16A:
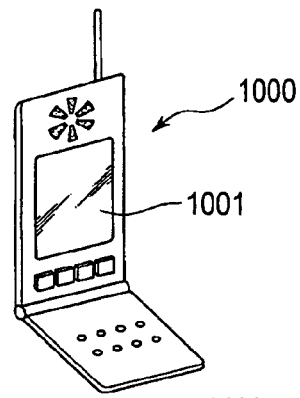
FIGS. 16A to 16D are illustrations showing examples of an electronic apparatus according to a third embodiment of the invention.

FIG. 16A is a perspective view of a mobile phone 1000 that is one of the examples. With reference to 16A, the mobile phone 1000 includes a display section 1001 similar to the EL display device 1.

Figure 16B:
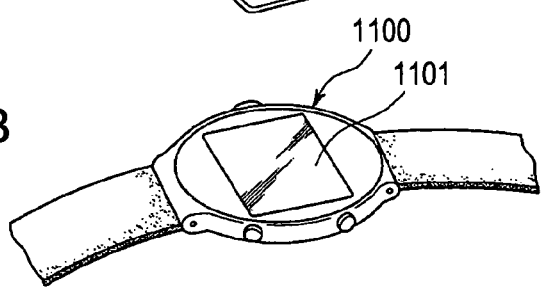

FIG. 16B is a perspective view of a watch-type electronic apparatus 1100 that is one of the examples. With reference to 16B, the watch-type electronic apparatus 1100 includes a display section 1101 similar to the EL display device 1.

Figure 16C:
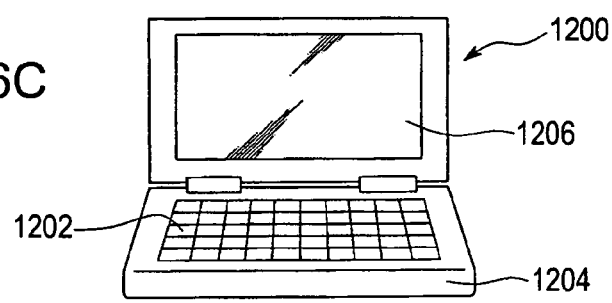

FIG. 16C is a perspective view of a portable information processor 1200 that is one of the examples. Examples of the information processor 1200 include word processors and personal computers. With reference to 16C, the information processor 1200 includes an input section 1202 such as a keyboard, a display section 1206 similar to the EL display device 1, and an information processor body (a casing) 1204.

Figure 16D:
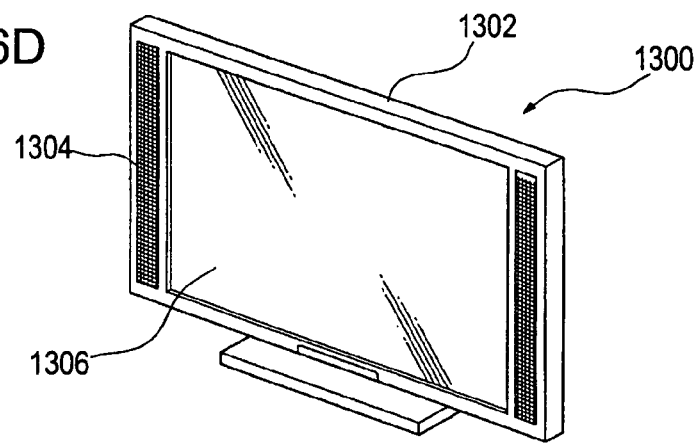

FIG. 16D is a perspective view of a flat-panel large-screen television 1300 that is one of the examples. With reference to 16D, the flat-panel large-screen television 1300 includes a flat-panel large-screen television body (a casing) 1302, an audio output section 1304 such as a speaker, and a display section 1306 similar to the EL display device 1.

Since the mobile phone 1000, the watch-type electronic apparatus 1100, the information processor 1200, and the flat-panel large-screen television 1300 include the display sections 1001, 1101, 1206, and 1306, respectively, similar to the EL display device 1, these apparatuses have long life.

Since the display section 1306 of the flat-panel large-screen television 1300 can be securely sealed without depending on the area thereof, the display section 1306 has a larger area (for example, a diagonal line with a length of 20 inches or more) as compared to display sections of known flat-panel large-screen televisions.

The electronic apparatus may include a light-emitting section similar to the EL display device 1 or 2. Examples of the electronic apparatus include page printers and image-forming apparatuses including exposure heads or line heads similar to the EL display device 1 or 2.

What is claimed is:

1. A light-emitting device, comprising:
    a base;
    a plurality of first electrodes;
    a second electrode;
    an organic functional layer disposed between the plurality of first electrodes and the second electrode, the second electrode covering the organic functional layer;
    an organic buffer layer having an elasticity, the organic buffer layer covering the second electrode;
    a gas barrier layer having an elasticity, the gas barrier layer covering the organic buffer layer;
    an intermediate protective layer disposed between the organic buffer layer and the gas barrier layer, the intermediate protective layer having a pattern and having an elasticity which is greater than the elasticity of the organic buffer layer and which is less than the elasticity of the gas barrier layer; and
    a region outside the intermediate protective layer, the gas barrier layer extending over the pattern of the intermediate protective layer and extending over the region outside the intermediate protective layer,
    the plurality of first electrodes, the organic functional layer, the second electrode, the organic buffer layer, the gas barrier layer and the intermediate protective layer being disposed above the base.

2. The light-emitting device according to claim 1, the organic buffer layer having an outer region and the intermediate protective layer covering the outer region of the organic buffer layer.

3. The light-emitting device according to claim 1, further comprising:
    a region outside the organic buffer layer;
    the organic buffer layer having a pattern, the intermediate protective layer extending over the pattern of the organic buffer layer and the region outside the organic buffer layer.

4. The light-emitting device according to claim 1, further comprising:
    a cathode-protecting layer covering the second electrode.

5. The light-emitting device according to claim 1, further comprising:
    a protective layer covering the gas barrier layer.

6. The light-emitting device according to claim 1, the organic buffer layer having an end portion with a contact angle of 45 degrees or less.

7. The light-emitting device according to claim 1, the intermediate protective layer being made of a metal fluoride.

8. The light-emitting device according to claim 7, the metal fluoride being lithium fluoride or sodium fluoride.

9. The light-emitting device according to claim 1, the intermediate protective layer being made of aluminum.

10. The light-emitting device according claim 1, the elasticity of intermediate protective layer being 10 to 100 GPa.

11. The light-emitting device according to claim 1, the organic buffer layer being made of an epoxy resin.

12. A light-emitting device, comprising:
    a base;
    a plurality of first electrodes;
    a second electrode;
    an organic functional layer disposed between the plurality of first electrodes and the second electrode, the second electrode covering the organic functional layer;
    an organic buffer layer having an upper face that is flat and having an elasticity, the organic buffer layer covering the second electrode;
    a first gas barrier layer having an elasticity, the gas barrier layer covering the organic buffer layer;
    a second gas barrier layer having an elasticity;
    an intermediate protective layer disposed between the first and second gas barrier layers, the intermediate protective layer having a pattern and having an elasticity which is greater than the elasticity of the organic buffer layer and which is less than the elasticity of one of the first gas barrier and the second gas barrier layer;
    a region outside the intermediate protective layer, the second gas barrier layer extending over the pattern of the intermediate protective layer and extending over the region outside the intermediate protective layer,
    the plurality of first electrodes, the organic functional layer, the second electrode, the organic buffer layer, the first gas barrier, the second gas barrier, and the intermediate protective layer being disposed above the base.

13. The light-emitting device according to claim 12, the organic buffer layer having an outer region and the intermediate protective layer laying on the outer region of the organic buffer layer.

14. The light-emitting device according to claim 12, further comprising:
    a region outside the organic buffer layer;
    the organic buffer layer having a pattern, the first gas barrier layer extending over the pattern of the organic buffer layer and the region outside the organic buffer layer, and the intermediate protective layer extending over the pattern of the organic buffer layer and the region outside the organic buffer layer.

15. The light-emitting device according to claim 12, the base having an outer region, the first gas barrier layer and the second gas barrier layer being in contact with each other above the outer region of the base.

16. The light-emitting device according to claim 12, the organic buffer layer having an end portion with a contact angle of 45 degrees or less.

17. The light-emitting device according to claim 12, the intermediate protective layer being made of a metal fluoride.

18. The light-emitting device according to claim 17, the metal fluoride being lithium fluoride or sodium fluoride.

19. The light-emitting device according to claim 12, the intermediate protective layer being made of aluminum.

20. The light-emitting device according to claim 12, the intermediate protective layer having an elasticity of 10 to 100 GPa.

21. The light-emitting device according to claim 12, the organic buffer layer being made of an epoxy resin.

22. A method for manufacturing a light-emitting device, comprising:
   providing a base;
   forming a plurality of first electrodes;
   forming a second electrode;
   forming an organic functional layer between the plurality of first electrodes and the second electrode, the second electrode covering the organic functional layer;
   forming an organic buffer layer having an outer region, an upper face that is flat, and an elasticity, the organic buffer layer covering the second electrode;
   forming a gas barrier layer having an elasticity, the gas barrier layer covering the organic buffer layer;
   forming an intermediate protective layer, between the organic buffer and the gas barrier layer, that covers the outer region of the organic buffer layer, the intermediate protective layer having a pattern and having an elasticity which is greater than the elasticity of the organic buffer layer and which is less than the elasticity of the gas barrier layer,
   the gas barrier layer extending over the pattern of the intermediate protective layer and extending over a region outside the intermediate protective layer,
   the plurality of first electrodes, the organic functional layer, the second electrode, the organic buffer layer, the gas barrier layer, and the intermediate protective layer being disposed above the base.

23. A method for manufacturing a light-emitting device, comprising:
   forming a plurality of first electrodes;
   forming a second electrode;
   forming an organic functional layer disposed between the plurality of first electrodes and the second electrode, the second electrode covering the organic functional layer;
   forming an organic buffer layer having an outer region, an upper face that is flat, and an elasticity, the organic buffer layer covering the second electrode;
   forming a first gas barrier layer, having a region that corresponds to the outer region of the organic buffer layer, the first gas barrier layer having an elasticity and covering the organic buffer layer;
   forming an intermediate protective layer covering the region of the first gas barrier layer that corresponds to the outer region of the organic buffer layer, the intermediate protective layer having a pattern and having an elasticity which is greater than the elasticity of the organic buffer layer and which is less than the elasticity of the first gas barrier layer; and
   forming a second gas barrier layer covering at least one of the intermediate protective layer and the first gas barrier layer,
   forming a region outside the intermediate protective layer, the second gas barrier layer extending over the pattern of the intermediate protective layer and extending over the region outside the intermediate protective layer,
   the plurality of first electrodes, the organic functional layer, the second electrode, the organic buffer layer, the first gas barrier, the intermediate protective layer, and the second has barrier layer being disposed above a base.

24. The method according to claim 22, the intermediate protective layer being made of a material with an elasticity of 10 to 100 GPa.

25. The method according to claim 22, the organic buffer layer being made of an epoxy resin.

26. The method according to claim 22, the organic buffer layer being formed in a vacuum atmosphere by a screen-printing process.

27. An electronic apparatus, comprising:
   the light-emitting device according to claim 1.

28. The light-emitting device of claim 1, further comprising a partition having a plurality of openings located at positions corresponding to the plurality of first electrodes.

29. The light-emitting device of claim 12, further comprising a partition having a plurality of openings located at positions corresponding to the plurality of first electrodes.

30. The method of claim 22, the plurality of first electrodes, the organic functional layer, the second electrode, the organic buffer layer, the gas barrier layer and the intermediate protective layer each disposed on the base.

31. The method of claim 23, the plurality of first electrodes, the organic functional layer, the second electrode, the organic buffer layer, the first gas barrier, the second gas barrier, and the intermediate protective layer being disposed on the base.

32. The light-emitting device of claim 28, the plurality of first electrodes, the partition, the organic functional layer, the second electrode, the organic buffer layer, the gas barrier layer and the intermediate protective layer each disposed on the base.

33. The light-emitting device of claim 29, the plurality of first electrodes, the partition, the organic functional layer, the second electrode, the organic buffer layer, the first gas barrier, the second gas barrier, and the intermediate protective layer being disposed on the base.

* * * * *